(12) United States Patent
Fischer et al.

(10) Patent No.: US 12,527,202 B2
(45) Date of Patent: Jan. 13, 2026

(54) OLED—BASED MATRIX LIGHT TRANSMITTER FOR HIGH-SPEED OPTICAL COMMUNICATION

(71) Applicants: CENTRE NATIONAL DE LA RECHERCHE SCIENTIFIQUE, Paris (FR); UNIVERSITE PARIS 13 PARIS-NORD VILLETANEUSE, Villetaneuse (FR)

(72) Inventors: Alexis Fischer, Bessancourt (FR); Alex Chamberlain Chime, Corbeil Essonnes (FR); Nixson Loganathan, Epinay sur Seine (FR)

(73) Assignees: CENTRE NATIONAL DE LA RECHERCHE SCIENTIFIQUE;, Paris (FR); UNIVERSITE PARIS 13 PARIS-NORD VILLETANEUSE, Villetaneuse (FR)

( * ) Notice: Subject to any disclaimer, the term of this patent is extended or adjusted under 35 U.S.C. 154(b) by 738 days.

(21) Appl. No.: 17/705,638

(22) Filed: Mar. 28, 2022

(65) Prior Publication Data
US 2022/0320207 A1    Oct. 6, 2022

(30) Foreign Application Priority Data
Mar. 29, 2021    (EP) .................................... 21305397

(51) Int. Cl.
*H01L 27/32* (2006.01)
*H01L 51/52* (2006.01)
(Continued)

(52) U.S. Cl.
CPC ..... *H10K 59/80515* (2023.02); *H10K 59/122* (2023.02); *H10K 59/173* (2023.02);
(Continued)

(58) Field of Classification Search
CPC ............... H10K 59/122; H10K 59/173; H10K 59/80521; H10K 59/80515;
(Continued)

(56) References Cited

U.S. PATENT DOCUMENTS

| 2002/0014836 A1 | 2/2002 | Codama |
| 2012/0223342 A1* | 9/2012 | Tanada .................. H10K 59/86 257/40 |

(Continued)

FOREIGN PATENT DOCUMENTS

| EP | 3462511 A1 | 9/2017 |
| EP | 3462510 A1 | 4/2019 |

(Continued)

OTHER PUBLICATIONS

European Search Report issued in corresponding European Patent Application No. 21305397 dated Sep. 9, 2021.

*Primary Examiner* — Steven B Gauthier
*Assistant Examiner* — Rhys Poniente Sheker
(74) *Attorney, Agent, or Firm* — Colson Law Group, PLLC

(57) ABSTRACT

A light emitting system (1) intended for optical communication, which presents several OLEDs (2) whose activation allows to obtain different levels of light intensity corresponding to different levels of light modulation, and which comprises an organic optoelectronic device (3) of the OLED (2) type having actuatable zones (5) each with a specific geometric pattern, on a substrate (5) which supports a first layer (6) formed by a plurality of transparent or opaque and conductive anodes (6a, 6b, 6c) laterally separated by engravings (7); a second layer for insulation (8) on regions of the first layer (6), serving to electrically insulate the anodes (6a, 6b, 6c) and to guarantee the continuity of the two following layers and having a thickness e1; a third layer (9) of thickness e2 comprising at least one stack of organic layers (Continued)

($9a$, $9b$); a fourth layer of metal (10) with a thickness $e3$ having a plurality of cathodes (10a, 10b) laterally separated from one another and covering said stack of organic layers (9a, 9b), lateral separation profiles (11) of the cathodes (10a, 10b) and of the organic layers (9a, 9b), for electrically insulation the cathodes (10a, 10b), of thickness $e4$ greater than $e1+e2+e3$, deposited on the first layer (6) or on the second layer (8).

15 Claims, 17 Drawing Sheets

(51) Int. Cl.
| | | |
|---|---|---|
| *H01L 51/56* | (2006.01) | |
| *H10K 59/122* | (2023.01) | |
| *H10K 59/173* | (2023.01) | |
| *H10K 59/80* | (2023.01) | |
| *H10K 77/10* | (2023.01) | |
| *H10K 102/00* | (2023.01) | |
| *H10K 102/10* | (2023.01) | |

(52) U.S. Cl.
CPC ....... *H10K 59/80521* (2023.02); *H10K 77/10* (2023.02); *H10K 77/111* (2023.02); *H10K 2102/103* (2023.02); *H10K 2102/3026* (2023.02)

(58) Field of Classification Search
CPC ........... H10K 59/00–95; H10K 50/813; H10K 50/822; H10K 50/818; H10K 50/00–88; H10K 77/10; H10K 77/111; H10K 2102/103; H10K 2102/3026; H04B 10/502; H04B 10/54; H04B 10/116
See application file for complete search history.

(56) References Cited

U.S. PATENT DOCUMENTS

| | | | | |
|---|---|---|---|---|
| 2015/0289344 | A1* | 10/2015 | Leadford | H05B 45/20 |
| | | | | 315/294 |
| 2019/0097163 | A1* | 3/2019 | Nkwawo | H10K 50/82 |
| 2022/0123074 | A1* | 4/2022 | Zhang | H10K 59/352 |

FOREIGN PATENT DOCUMENTS

| | | |
|---|---|---|
| JP | 2007173525 A | 7/2007 |
| JP | 2013089524 A | 5/2013 |

* cited by examiner

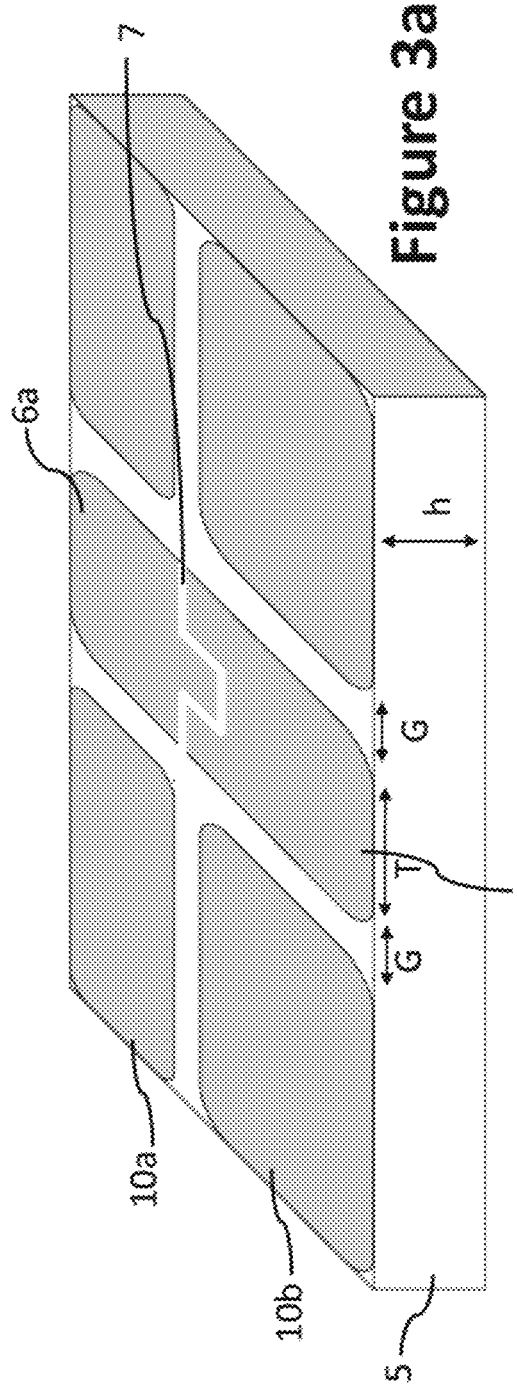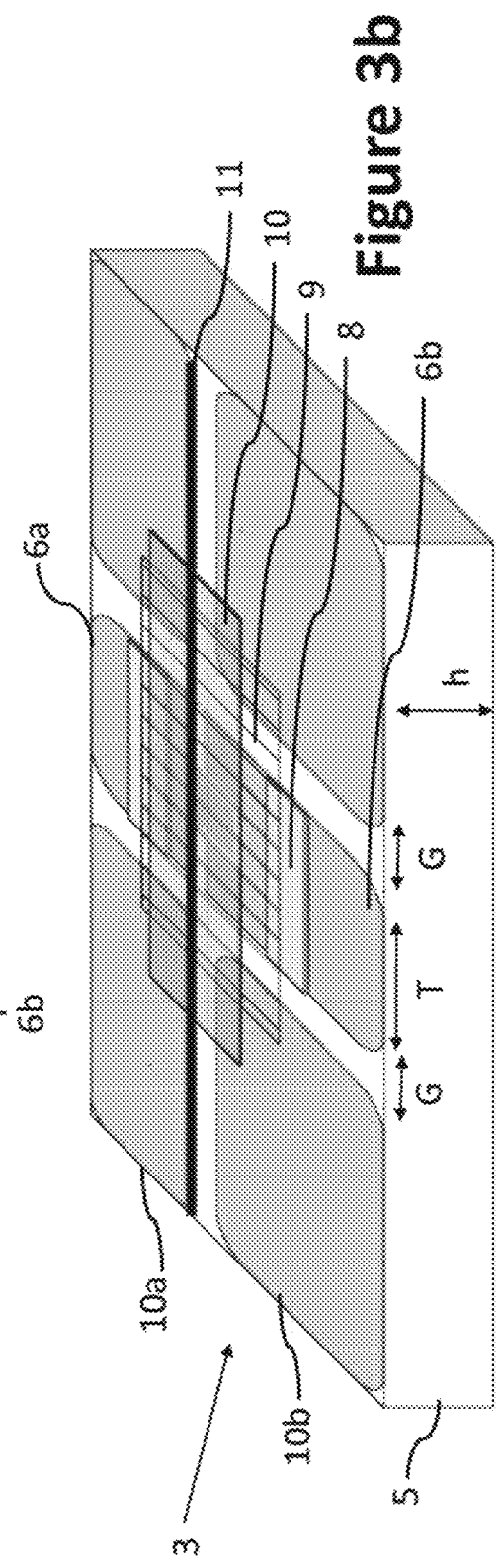

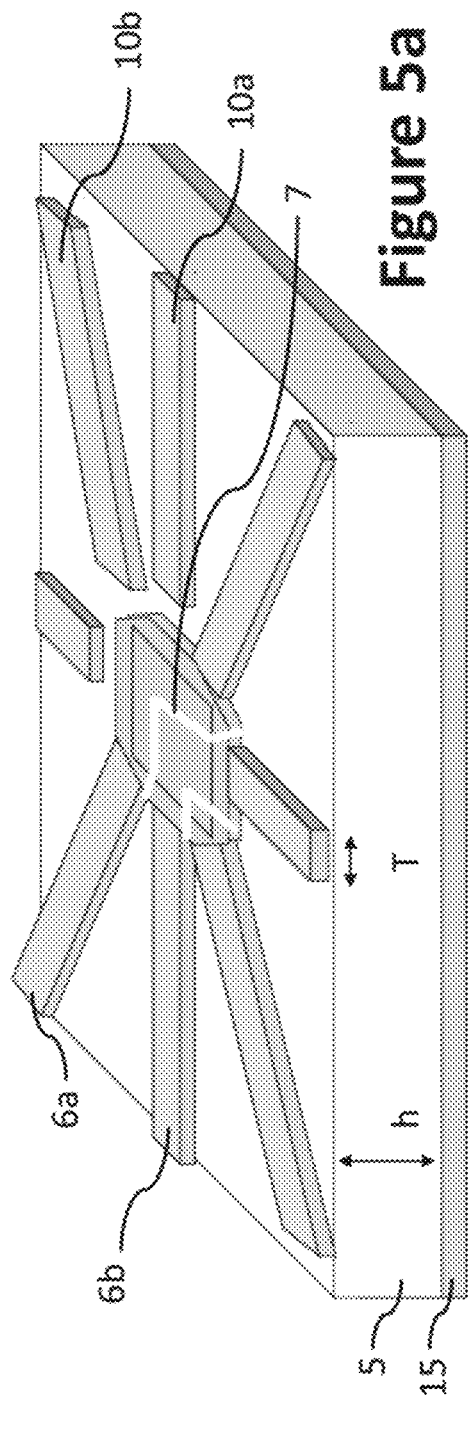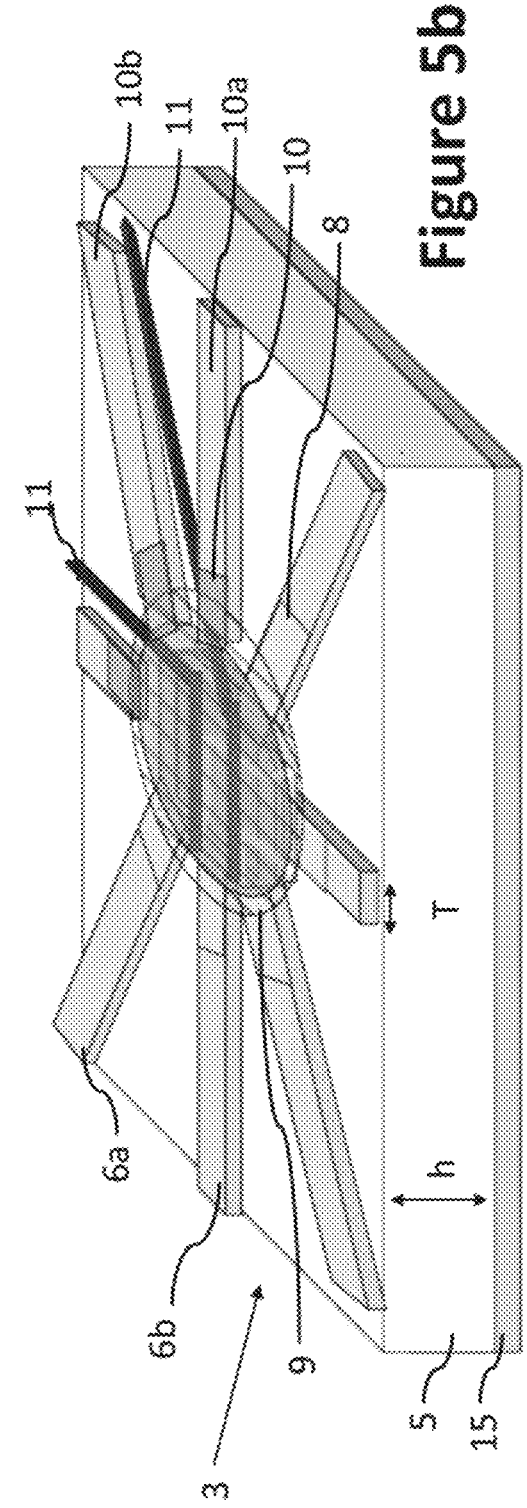

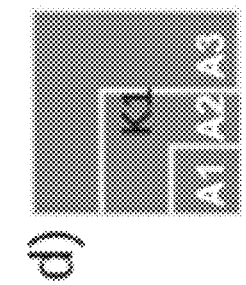
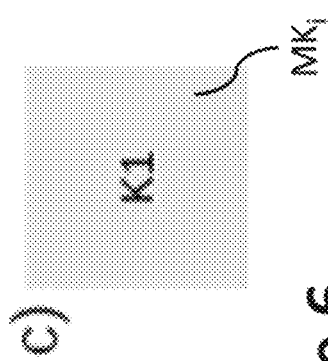
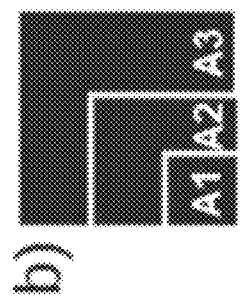
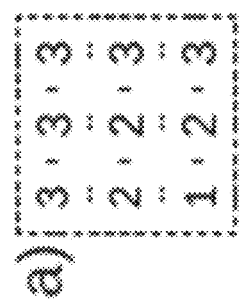
Figure 6
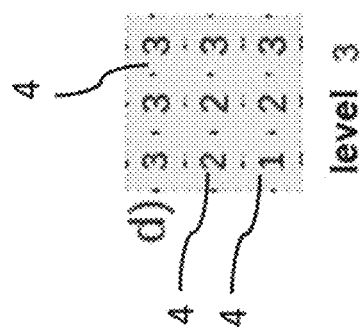
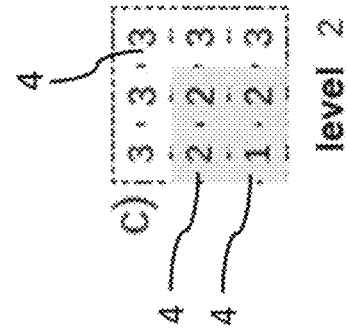
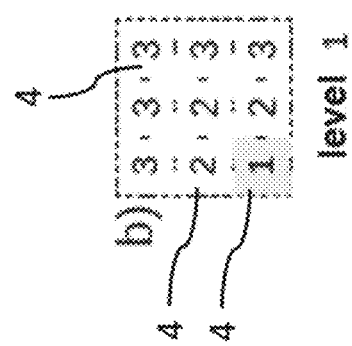
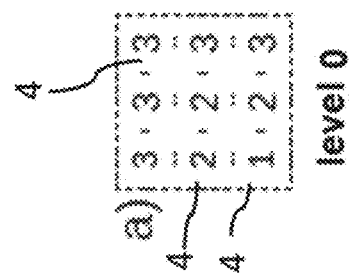
Figure 7

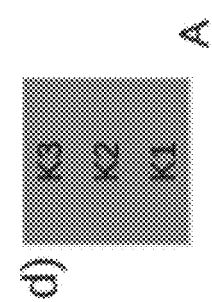
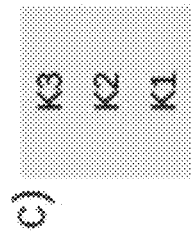
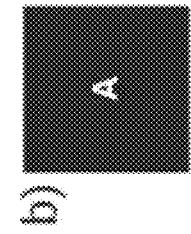
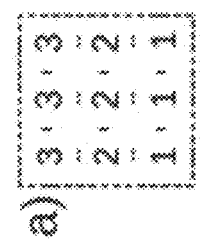
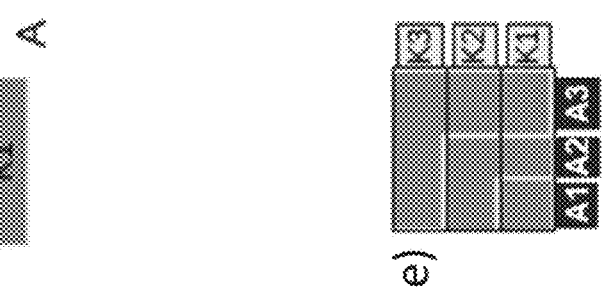
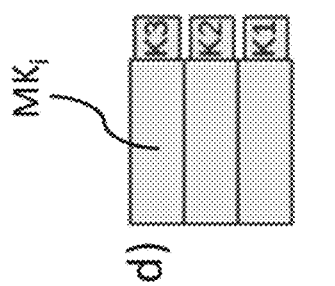
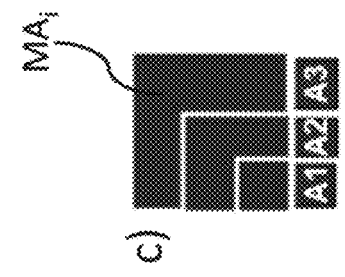
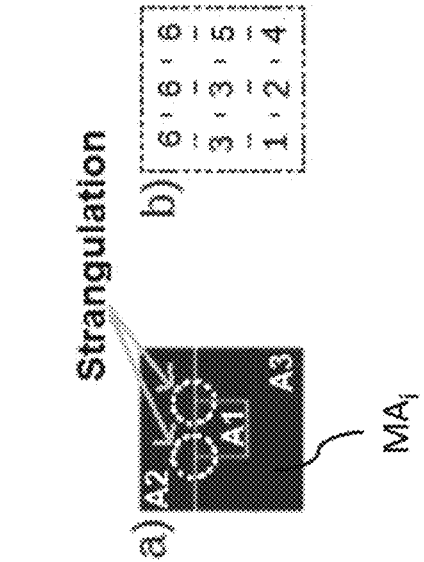
Figure 8
Figure 9

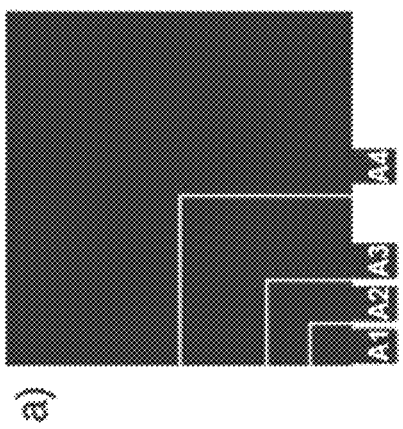
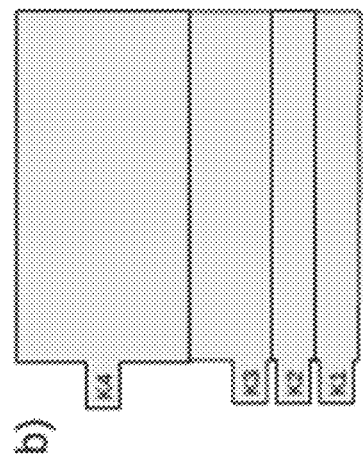
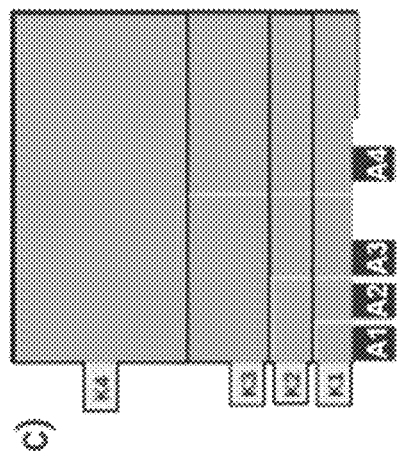
Figure 18
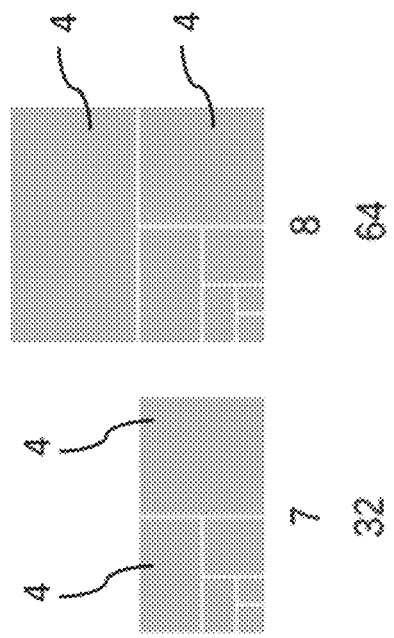
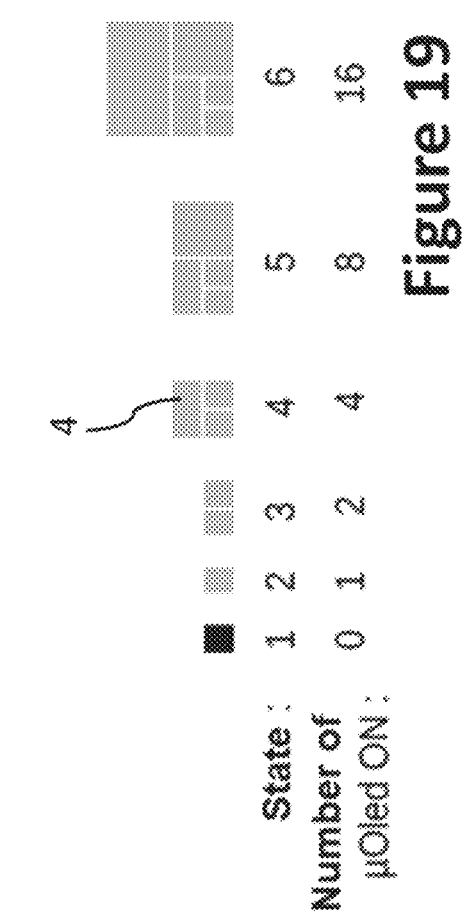
Figure 19

OLED—BASED MATRIX LIGHT TRANSMITTER FOR HIGH-SPEED OPTICAL COMMUNICATION

FIELD OF THE INVENTION

The present invention relates to the principle of design and production of matrix light emitters based on organic optoelectronics, such as organic light-emitting diodes (OLEDs), making it possible to emit variable light intensities for high-speed optical communication. These emitters require only limited technological complexity, making them suitable for use in signage and packaging on embedded objects, possibly on flexible substrates.

STATE OF ART

Over the last few decades, light-emitting diodes (LEDs) have been widely studied in the field of Optical Wireless Communications (OWC) due to their predominance in high-end TVs and other display technologies. The field of short-range OWCs brings new applications requiring ultra-high data rates, such as Optical Network-on-Chip (OnoC), optical interconnects for artificial intelligence (A.I.), optical hardware accelerators and rotary joints for space systems, industry and the Internet.

For these applications, increasingly higher data rates are desirable and requirements above 10 GB/s are beginning to appear. However, commercially available LEDs have limitations partly due to the high electrical response time of these components and more specifically their parasitic capacitance, so LEDs cannot achieve these objectives.

The article "Towards 10 Gb/s orthogonal frequency division multiplexing-based visible light communication using a GaN violet micro-LED" by Mohamed S. Islim et al, demonstrates the interest of Gallium Nitride based micro-LEDs (GaN-LEDs) which offer smaller parasitic capacities and therefore higher bandwidths. The article also discusses μ GaN-LEDs offering bandwidths up to 300 MHz and data rates up to 7.9 Gb/s.

Researchers and applicants have deposited two patents: EP17306292.8 and EP17306293.6 on fast OLEDs for emitting a light impulse in response to an electrical impulse, showing data transmissions at 1.13 Gb/s achieved with fast OLEDs with a bandwidth of 245 MHz.

SUMMARY OF THE INVENTION

One aim of the invention is to combine in a matrix form several fast OLEDs of different sizes to significantly increase the transmission rate to the level of what is practised in traditional telecommunications (~10 Gbit/s and above).

In order to integrate several micro-LEDs on the same substrate, it was necessary to adapt the cathode and anode stack to have light-emitting areas with different surfaces while maintaining a very fast response and analysis time.

Here, the invention presents a light emitting system intended for optical communication, having several OLEDs whose activation allows to obtain different levels of light intensity corresponding to different levels of light modulation, and which comprises:

an organic optoelectronic device with OLEDs, the organic optoelectronic device having laterally separated actuatable zones on a substrate which supports:

a first layer formed by several transparent and conductive anodes laterally separated by engravings, each anode $A_i$ having a specific geometric pattern $MA_i$;

a second layer for insulation on parts of the first layer, serving to electrically insulate the anodes so as to have separated anodes and the second layer for insulation having a thickness $e1$;

a third layer having a thickness $e2$ and comprising at least one stack of organic layers;

a fourth layer in metal having a thickness $e3$, and composed of several cathodes laterally separated from each other and covering said stack of organic layers, each cathode $K_j$ having a specific geometrical pattern $MK_j$;

lateral separation profiles of the cathodes and of organic layers, to electrically insulate the cathodes, so as to have separated cathodes, the lateral separation profiles having a thickness $e4$ greater than $e1+e2+e3$, and being deposited on the first layer or on the second layer, the covering of the anodes, the stack of organic layer, and the cathodes, being realized so as to face each other:

separated anodes and a common cathode;
separated anodes and separated cathodes; and/or
a common anode and separated cathodes;

defining different actuatable zones, each actuatable zone comprising at least one cathode part and at least one anode part facing each other, a power supply, electrical wires and electrical contacts connected to the anodes and cathodes for their voltage supply so as to allow during an activation:

a switching on of a combination of actuatable zones, the surface of which is less than or equal to the common surface of the facing activated anodes and activated cathodes:

connected to the electric wires, means for selective activation and displaying, to activate and display at each activation a total luminous surface which varies according to the number of actuatable zones turned on, so as to obtain different levels of luminous intensity of the system corresponding to different levels of light modulation, for different activations.

Preferably, the cathodes $K_j$ have specific geometrical patterns $MK_j$ different from the geometrical patterns $MA_i$ specific to the anodes.

Preferably, the cathodes $K_j$ have specific geometrical patterns $MK_j$ different from each other, and/or the geometrical patterns $MAI$ specific to the anodes have specific geometrical patterns $MK_j$ different from each other.

Advantageously, the OLEDs are easy to integrate on silicon substrate or on III-V substrates for use in onboard optics or for organic photonic above IC.

The system can present means for selective activation and displaying, which are configured to enable at least 3 levels of light intensity to be achieved with the actuatable zones:

a first level of light intensity, by the activation of one actuatable zone, by the combination of an activated anode, and an activated cathode facing the anode, a second level of light intensity by the activation of two actuatable zones:

by a combination of at least two activated anodes facing at least one activated cathode, or by a combination of at least one activated anode facing at least two activated cathodes, a third level of light intensity by the activation of three actuatable zones:
- by a combination of at least three activated anodes facing at least one activated cathode, or
- by a combination of at least one activated anode facing least three activated cathodes, or
- by a combination of at least two activated anodes facing least two activated cathodes.

The OLEDs forming the organic Opto-Electronic device and emit a light impulse can have a time response below 10 ns, in response to an electrical impulse having a pulse duration time below 10 ns.

The challenge solved by the inventors is to make a component consisting of several fast OLED emitters.

Two obstacles are overcome, the first obstacle is based on classical display techniques that use the decomposition of the display screen into pixels arranged at the intersections of rows and columns of a grid (or matrix) of horizontal and vertical interconnections. Note that in a display, the pixels all have the same size, therefore at similar current density they have the same luminous intensity, this does not allow to realize light sources of different light intensities corresponding to the different levels of modulation to be able to achieve a higher throughput.

The second obstacle concerns the response time of these light emitters. The interconnection circuits of the pixel-based displays introduce serial resistors and parasitic capacitances that limit the bandwidth to several 100 Hz.

In order to design ultra-fast OLED light arrays, researchers and applicants seek to combine microwave technologies (ultra-fast response) and OLED display technology (electrode stacking) by structuring them in the form of arrays. It is possible to structure patterns in OLEDs in different ways, either at the anode, at the cathode, or by a combination of both. (common anode-separate cathodes; separate anodes-common cathode; combination)

BRIEF DESCRIPTION OF THE DRAWINGS

Other advantages and characteristics of the disclosed devices and methods will become apparent from reading the description, illustrated by the following figures, where:

FIG. 3a represents a perspective view of the organic optoelectronic device of FIGS. 2a and 2b, according to the invention of CPW electrodes in GSG configuration with two separated anodes, without: the lateral separation profiles, the organic layer and the fourth layer of metal.

FIG. 3b represents a perspective view of the organic optoelectronic device of FIGS. 2a and 2b, according to the invention in CPW HP (GSG) configuration {2×2 OLED matrix; 2 cathodes (one first cathode K1+K'1 with metal on the first side of the lateral separation profile; one second cathode: K2+K'2 with metal on the second side of the lateral separation profile)×2 anodes OLED matrix}.

FIG. 5a represents a perspective view of the organic optoelectronic device of FIGS. 4a and 4b, according to the invention in biplanar (microstrip) configuration with three separated anodes, without the lateral separation profiles, the organic layer and the fourth layer of metal.

FIG. 5b represents a perspective view of the organic optoelectronic device of FIGS. 4a and 4b, according to the invention in biplanar (microstrip) configuration (3×3 OLED matrix; 3 cathodes×3 anodes OLED matrix).

FIG. 6 represents a 1×3 OLED matrix (1 cathode×3 anodes OLED matrix), and elements with the following configuration: Separated anodes-Common cathode.

The image shown at (a) in FIG. 6 represents a 1×3 OLED matrix (1 cathode×3 anodes OLED matrix) with 3 actuatable zones.

The image shown at (b) in FIG. 6 represents a separation of the anode into three zones (A1, A2, A3).

The image shown at (c) in FIG. 6 represents a common cathode (K1).

The image shown at (d) in FIG. 6 represents a complete structure of OLED matrix by superposition of the cathode with the anodes.

FIG. 7 represents a 1×3 OLED matrix (1 cathode×3 anodes OLED matrix) with 3 actuatable zones with different levels of light intensity for the biplanar configuration; a) no light emission; b) low intensity light emission; c) medium intensity light emission; d) high intensity light emission.

FIG. 8 represents a 3×1 OLED matrix (3 cathodes×1 anode OLED matrix) and elements with the following configuration: Common anode-Separated cathodes The image shown at (a) in FIG. 8 represents a 3×1 OLED matrix (3 cathodes×1 anode OLED matrix) with 3 actuatable zones.

The image shown at (b) in FIG. 8 represents a common anode (A).

The image shown at (c) in FIG. 8 represents a separation of the cathode into three zones (K1, K2, K3).

The image shown at (d) in FIG. 8 represents a complete structure of OLED matrix by superimposing the cathodes with the anode.

FIG. 9 represents a 3×3 OLED matrix (3 cathodes×3 anodes OLED matrix) and elements with the following configuration: Separated anodes-Separated cathodes.

The image shown at (a) in FIG. 9 represents a possible separation of the anode into three zones, with points of strangulation.

The image shown at (b) in FIG. 9 represents a 3×3 OLED matrix (3 cathodes×3 anodes OLED matrix) with 6 actuatable zones.

The image shown at (c) in FIG. 9 represents a separation of the anode into three zones (A1, A2, A3).

The image shown at (d) in FIG. 9 represents a separation of the cathode into three zones (K1, K2, K3).

The image shown at (e) in FIG. 9 represents a complete structure of OLED matrix by superimposing the cathodes with the anodes.

Figure 10:
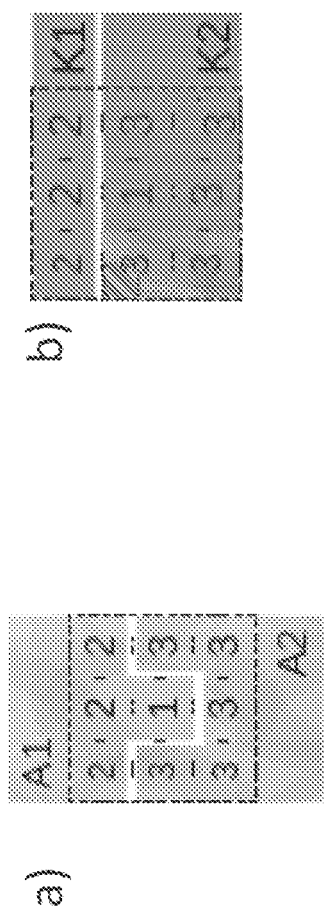

FIG. 10 represents a 2×2 OLED matrix (2 cathodes×2 anodes OLED matrix), and elements with the following configuration: Separated anodes-Separated cathodes.

The image shown at (a) in FIG. 10 represents a separation of the anode into two zones (A1, A2).

The image shown at (b) in FIG. 10 represents a separation of the cathode into two zones (K1, K2).

Figure 11:
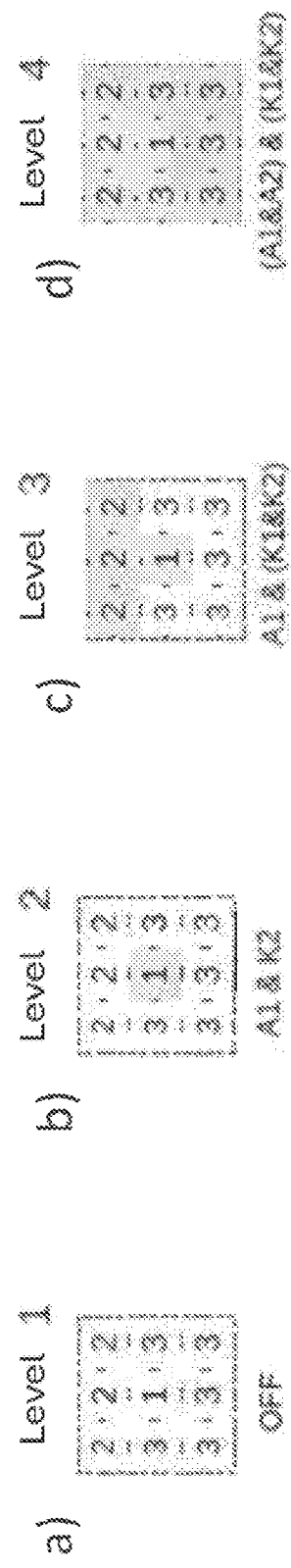

FIG. 11 represents a 2×2 OLED matrix (2 cathodes×2 anodes OLED matrix) with 3 actuatable zones with different levels of light intensity for the CPW configuration; a) no light emission; b) low intensity light emission; c) medium intensity light emission; d) high intensity light emission.

Figure 12:
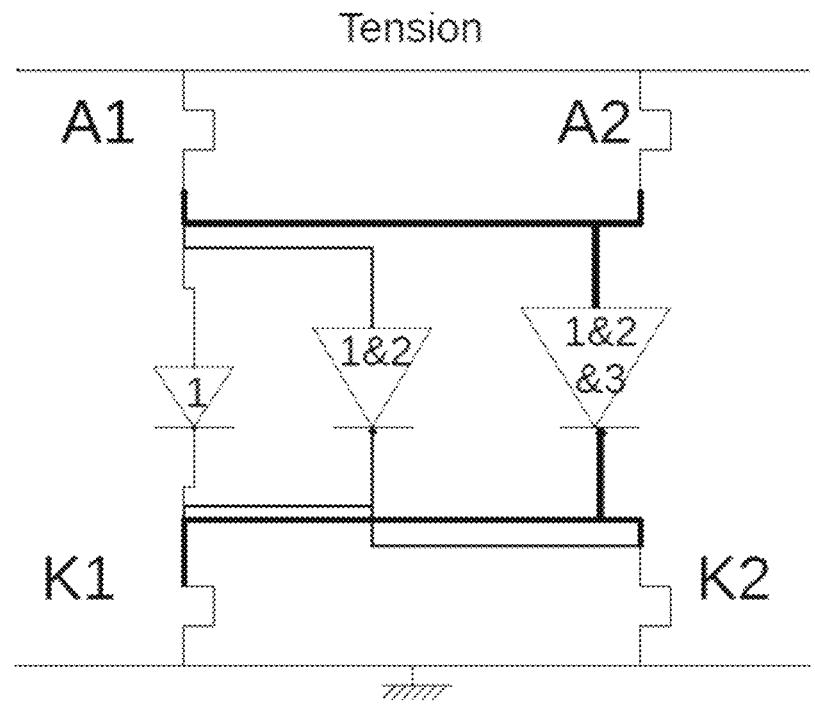

FIG. 12 represents the electrical schematic equivalent to the 2×2 OLED matrix (2 cathodes×2 anodes OLED matrix) of the CPW configuration.

Figure 13:
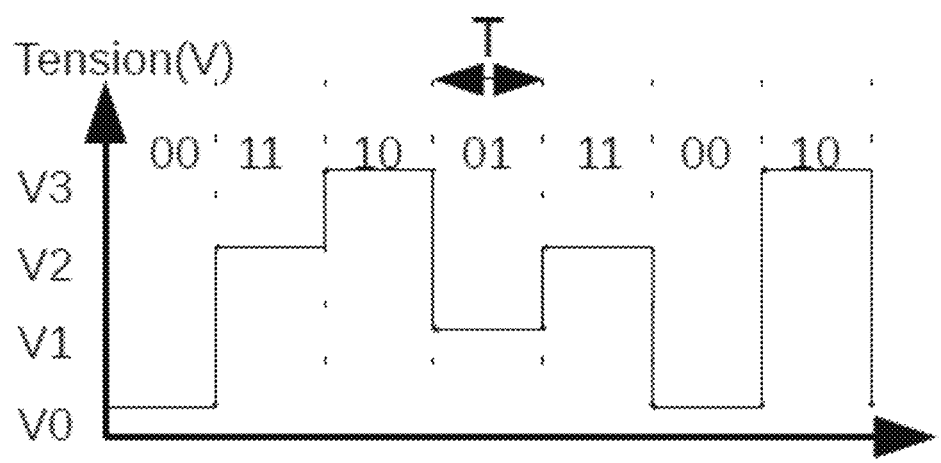

FIG. 13 represents the total voltage as a function of time, varying on 4 different voltage levels, each level is associated to a combination of two bits.

Figure 14:
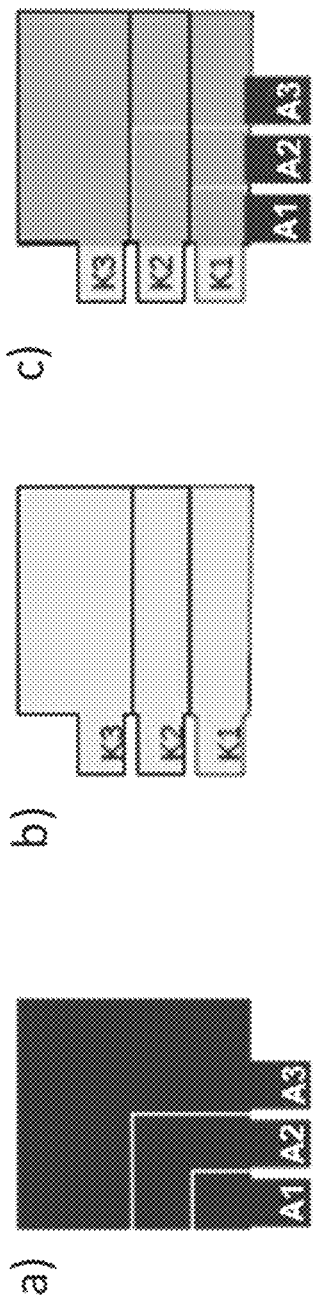

FIG. 14 represents a represents a 3×3 OLED matrix (3 cathodes×3 anodes OLED matrix) and elements with the following configuration: Separated anodes-Separated cathodes; a) a separation of the anode into three zones (A1, A2, A3); b) a separation of the cathode into three zones (K1, K2, K3); c) a complete structure of OLED matrix by superimposing the cathodes with the anodes.

Figure 15:
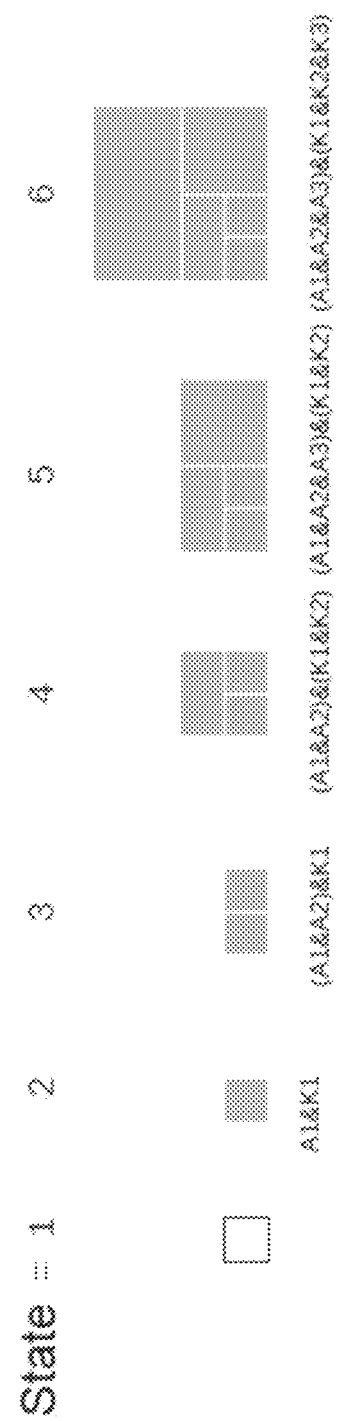

FIG. 15 represents 6 possible states of different light intensity levels.

Figure 16:
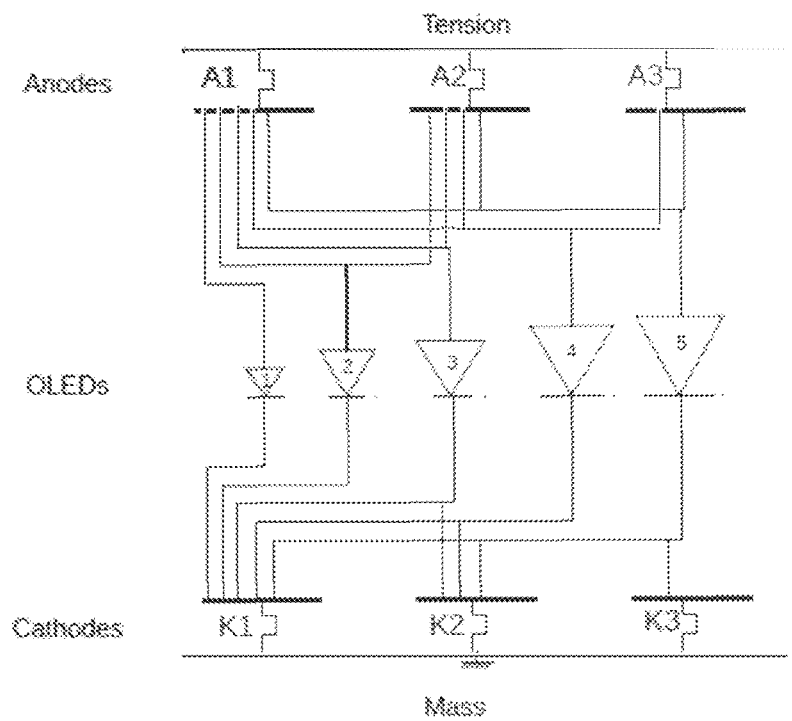

FIG. 16 represents the electrical schematic equivalent to the 3×3 OLED matrix (3 cathodes×3 anodes OLED matrix) of the biplanar configuration.

Figure 17:
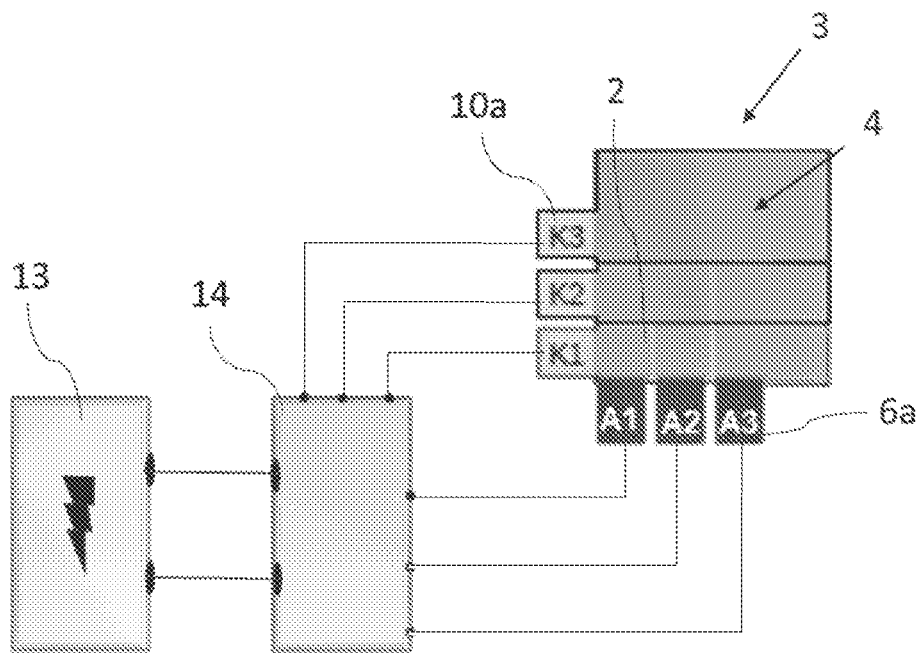

FIG. 17 represents the light emitting system with the organic optoelectronic device with OLEDs (3 cathodes×3 anodes OLED matrix), the power supply and the means for selective activation and displaying.

FIG. 18 represents a represents a 4×4 OLED matrix (4 cathodes×4 anodes OLED matrix), and elements with the following configuration: Separated anodes-Separated cathodes; a) a separation of the anode into four zones (A1, A2, A3, A4); b) a separation of the cathode into four zones (K1, K2, K3, K4); c) a complete structure of OLED matrix by superimposing the cathodes with the anodes.

FIG. 19 represents 8 possible states of different light intensity levels.

Figure 20:
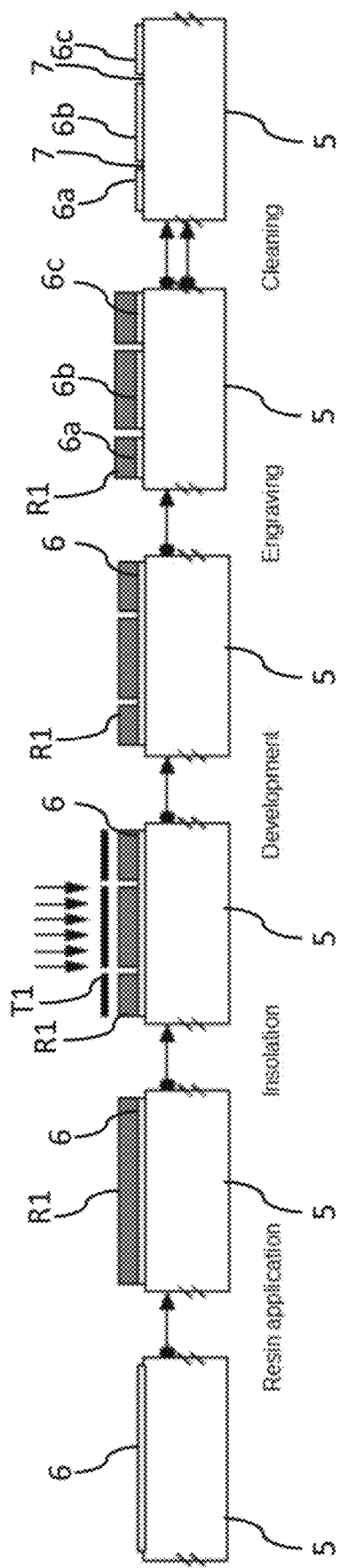

FIG. 20 represents an anode structuring process by engraving.

Figure 21:
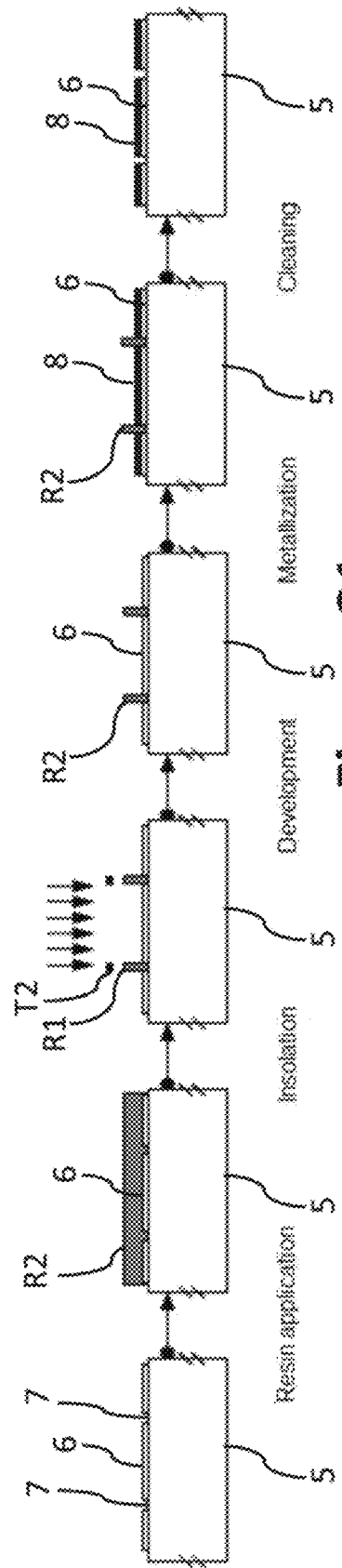

FIG. 21 represents an anode structuring process by metallization.

Figure 22:
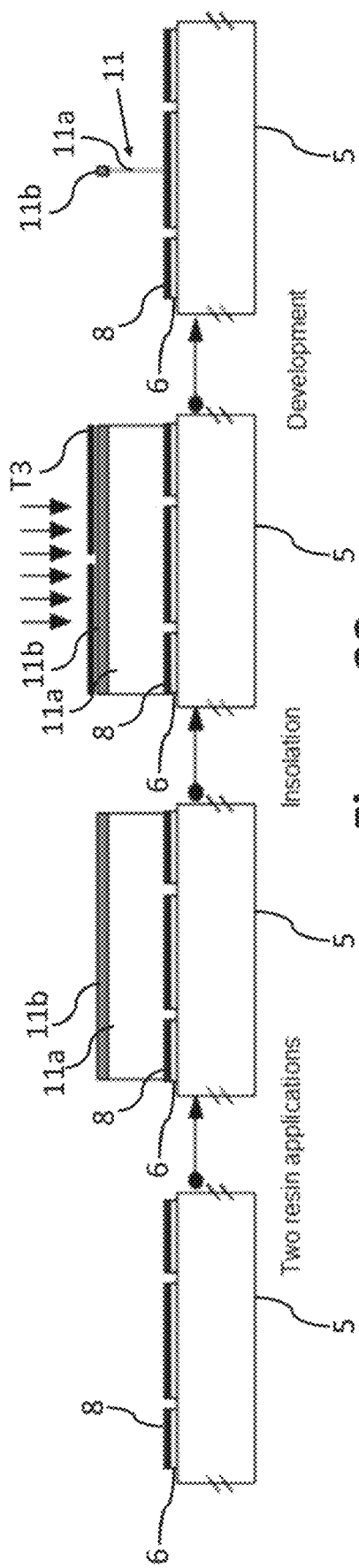

FIG. 22 represents a process for the realization of undercut resin inducing cathode separation.

Figure 23:
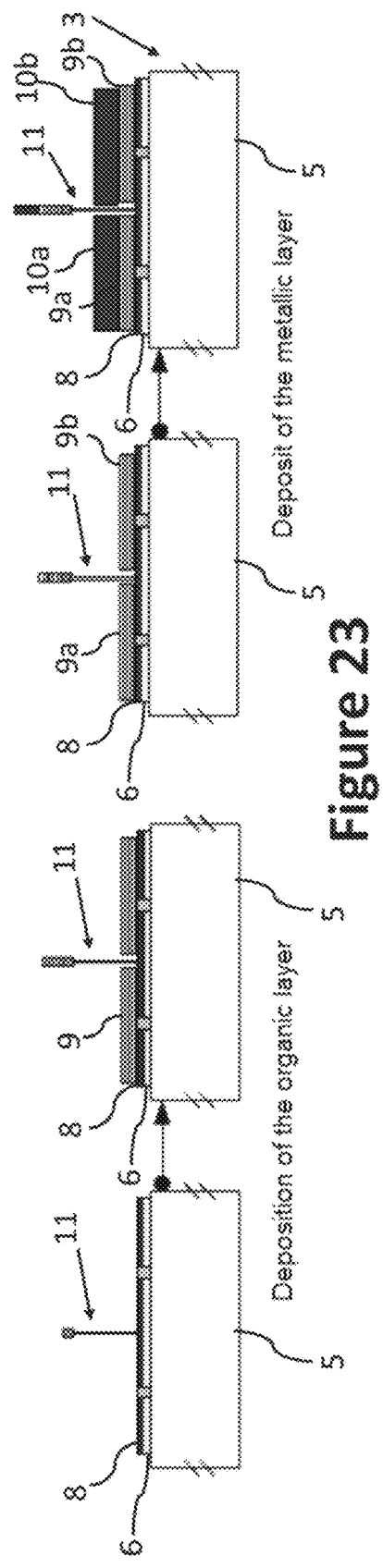

FIG. 23 represents a deposition of organic and metallic layers.

Figure 24:
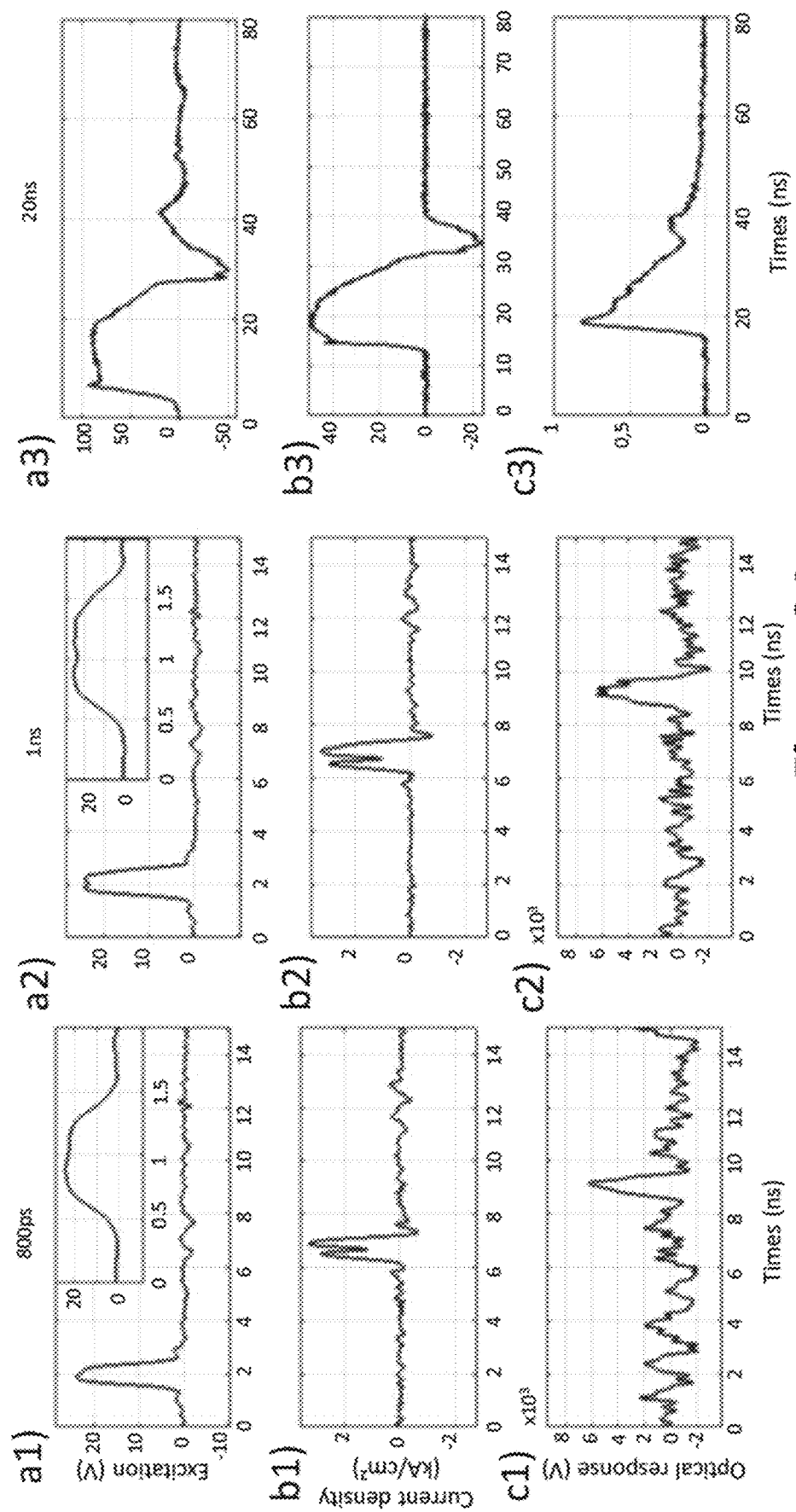

FIG. 24 represents the study of the electrical and optical responses of μOLEDS small molecules under pulsed excitation: the figures show the excitation signal (a1, a2, a3), the electrical response (b1, b2, b3) and the optical response (c1, c2, c3) for pulses of 800 ps (a1, b1, c1), 1 ns (a2, b2, c2) and 20 ns (a3, b3, c3).

Figure 25A:
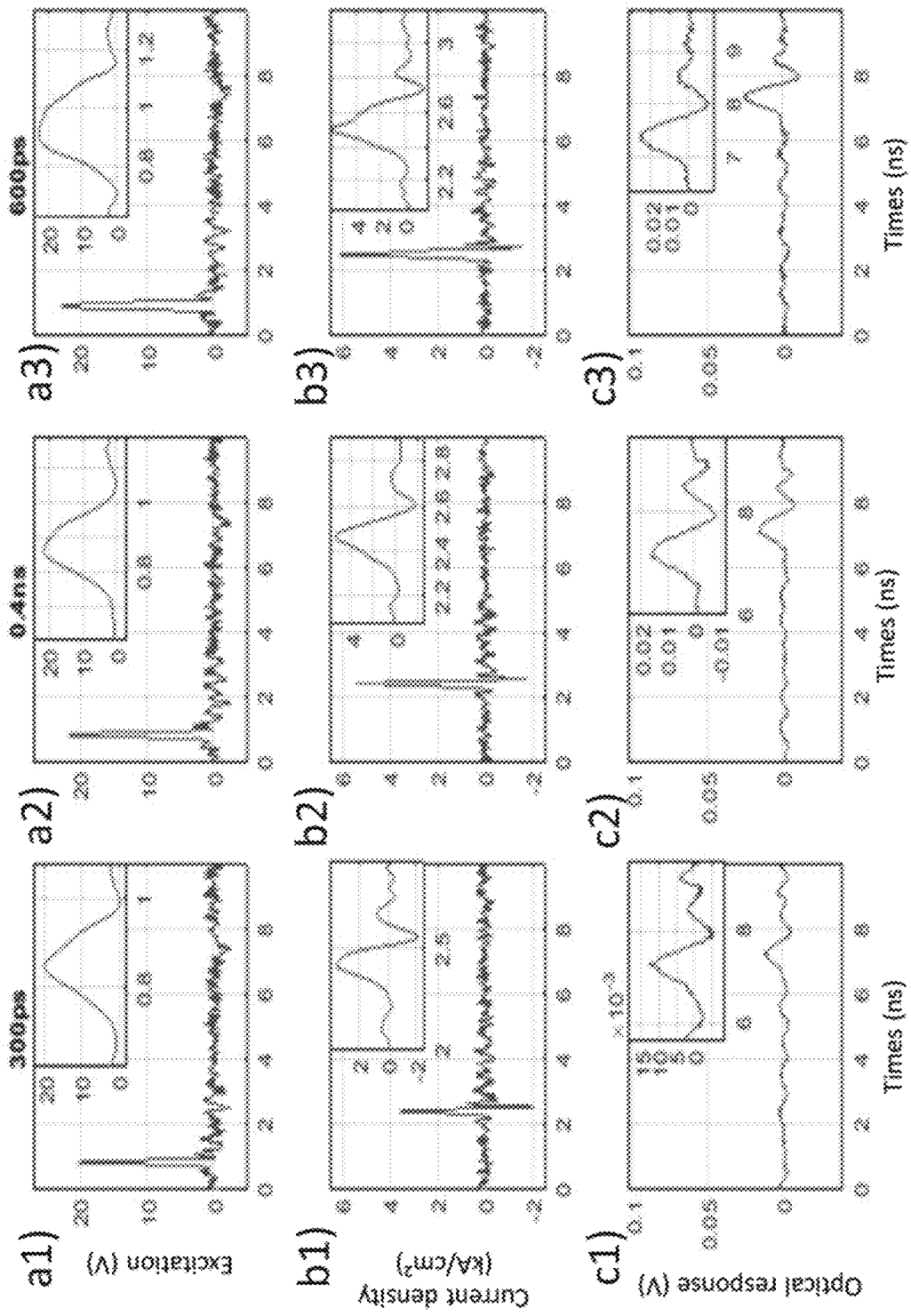
Figure 25B:
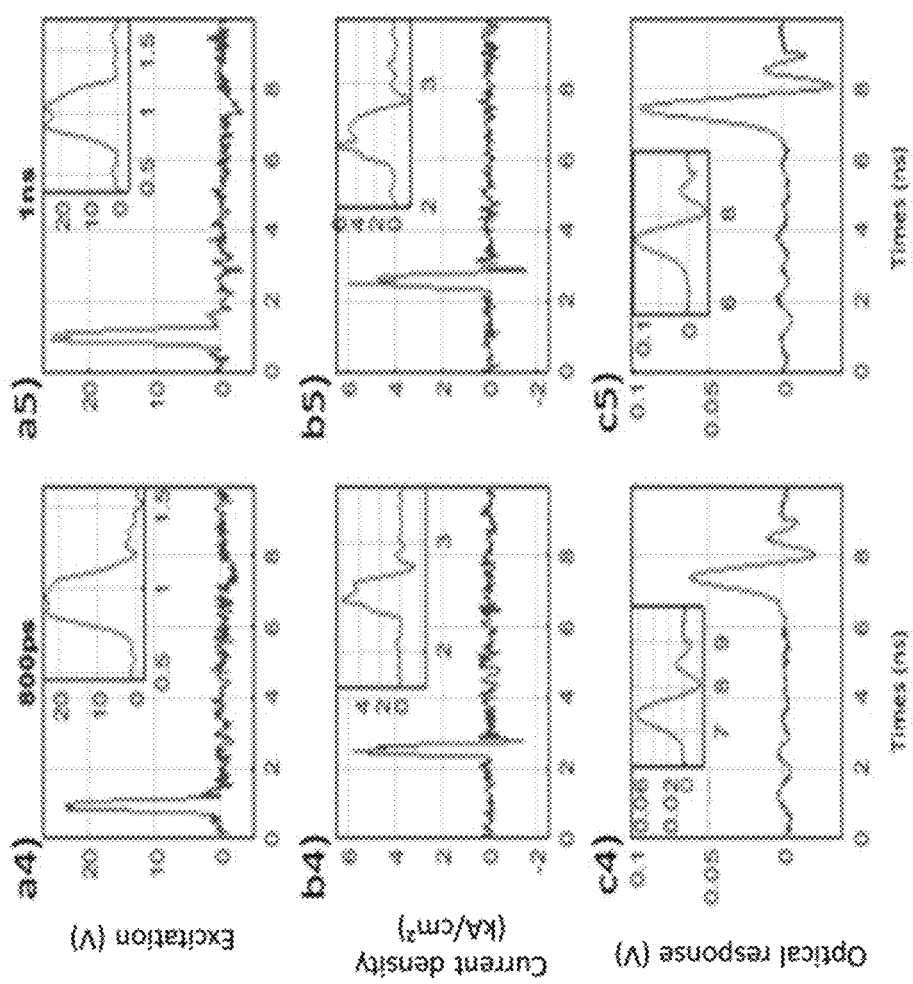

FIGS. 25A & 25B represents the study of the electrical and optical responses of μOLEDS polymers under pulsed excitation: the figures show the excitation signal (a1, a2, a3, a4, a5), the electrical response (b1, b2, b3, b4, b5) and the optical response (c1, c2, c3, c4, c5) for 300 ps pulses (a1, b1, c1), 0.4 ns (a2, b2, c2), 600 ps (a3, b3, c3), 800 ps (a4, b4, c4) and 1 ns (a5, b5, c5).

DETAILED DESCRIPTION

The invention relates to a light emitting system 1 intended for optical communication, which presents several OLEDs 2 whose activation allows to obtain different levels of light intensity corresponding to different levels of light modulation.

The light emitting system 1 is represented schematically on FIG. 17.

Figure 1:
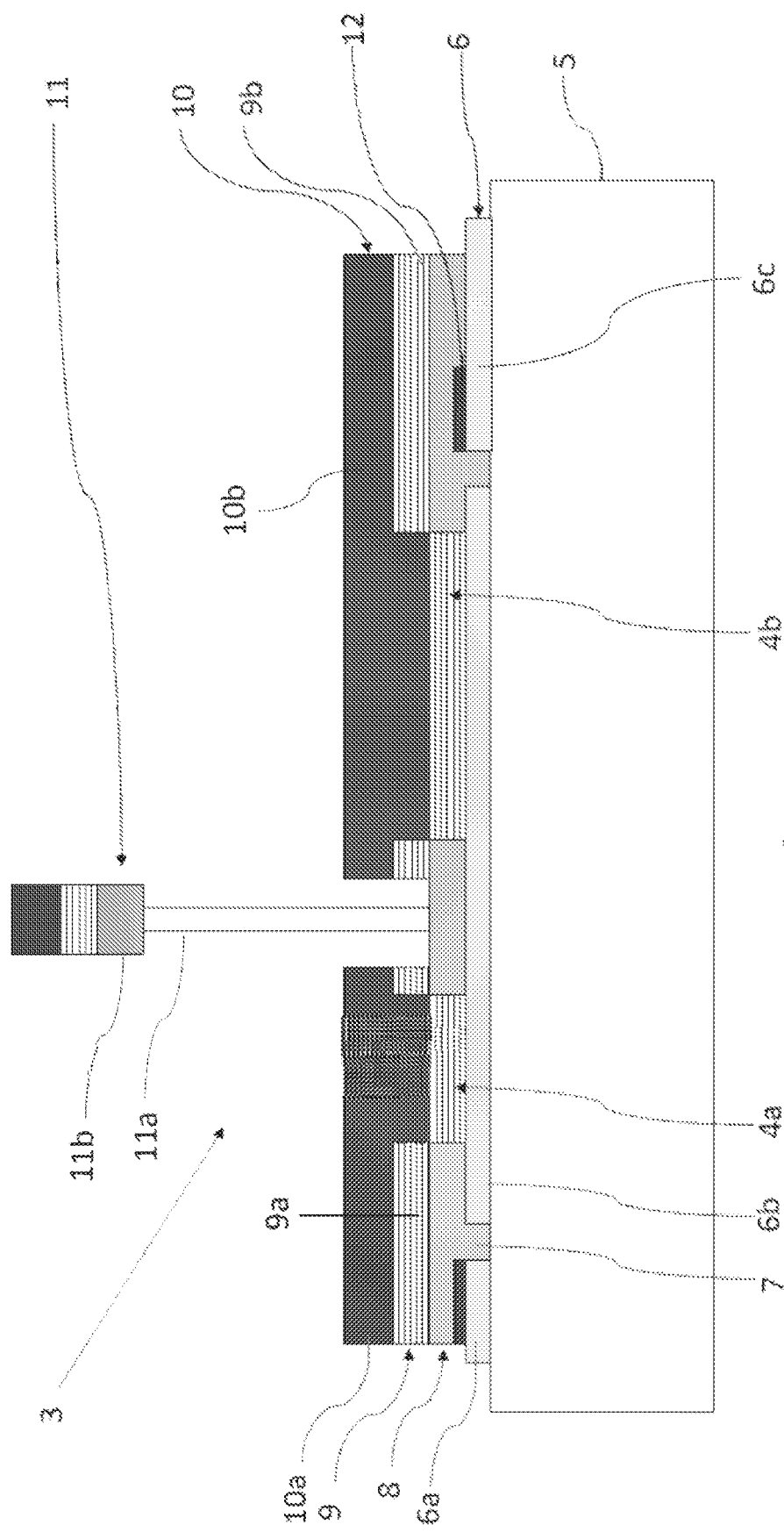
FIG. 1 represents the organic optoelectronic device of the OLEDs type.

The light emitting system 1 comprises:
an organic optoelectronic device 3 with OLEDs 2, as represented on FIG. 1, the organic optoelectronic device 3 having laterally separated actuatable zones 4a, 4b, on a substrate 5 which supports:
a first layer 6 formed by several transparent and conductive anodes 6a, 6b, 6c laterally separated by engravings 7, each anode Ai having a specific geometric pattern MAI;
a second layer for insulation 8 on parts of the first layer 6, serving to electrically insulate the anodes 6a, 6b, 6c so as to have separated anodes, and the second layer for insultation having a thickness e1;
a third layer 9 with a thickness e2 comprising at least one stack of organic layers 9a, 9b, (the organic layers 9a, 9b which are in direct contact with the anodes 6a, 6b, 6c being actuatable while the organic layers 9a, 9b which are deposited on the second layer 8 are inert);
a fourth layer 10 in metal having a thickness e3, and composed of several cathodes 10a, 10b laterally separated from each other and covering (fully) said stack of organic layers 9a, 9b, each cathode Kj having a specific geometrical pattern MKj;
lateral separation profiles 11 of the cathodes 10a, 10b and of organic layers 9a, 9b, to electrically insulate the cathodes 10a, 10b so as to have separated cathodes, the lateral separation profiles 11 having a thickness e4 greater than e1+e2+e3, and being deposited on the first layer 6 or on the second layer 8,
the covering of the anodes 6a, 6b, 6c, the stack of organic layer 9a, 9b, and the cathodes 10a, 10b, being realized so as to face each other:
separated anodes and a common cathode;
separated anodes and separated cathodes; and/or
a common anode and separated cathodes;
defining different (separated) actuatable zones 4a, 4b, each actuatable zone 4a, 4b comprising at least one cathode part and at least one anode part facing each other, As represented on FIG. 17, the light emitting system 1 presents also:
a power supply 13, electrical wires and electrical contacts connected to the anodes and cathodes for their voltage supply so as to allow during activation:
the switching on of a combination of actuatable zones 4a, 4b, the surface of which is less than or equal to the common surface of the facing activated anodes and activated cathodes;
connected to the electric wires, means for selective activation and displaying 14, to activate and display at each activation a total luminous surface which varies according to the number of the actuatable zones 4a, 4b turned on, so as to obtain different levels of luminous intensity of the system 1 corresponding to different levels of light modulation, for different activations.

The power supply 13 can be a cell, a battery or a photovoltaic cell.

Advantageously, as represented on FIGS. 1 and 22, the lateral separation profiles 11 are produced by photolithography and development and have a stack of two resins deposited on each other with a non-photosensitive resin 11a deposited in contact with the first layer 6 or the second layer 8, and a positive photosensitive resin 11b on the non-photosensitive resin 11a.

In a possible embodiment, the lateral separation profiles 11 are produced by photolithography and development, and the second layer 8 is a negative photosensitive resin 11a.

Advantageously, the lateral separation profiles 11 have a thickness at least four times greater than the sum of the thicknesses e1+e2+e3. More precisely, the thickness of the lateral separation profiles 11 is one to several micrometers.

Advantageously, the lateral separation profiles 11 have inverted profiles whose tip is in contact with the first layer 6 or the second layer 8 and whose base widened with respect to the tip is located above the fourth layer 10.

Advantageously, the lateral separation profiles 11 have a long part 11a (composed of negative photosensitive) in contact with the layer for insulation 8 and a head 11b on the long part 11a, the head 11 b is larger than the long part 11a, so as to create a space between the long part 11a and the cathodes 10a, 10b.

The OLEDs 2 can be milli-OLEDs and/or micro-OLEDs.

1) Fast OLED

More preferably, the OLEDs 2 are micro-OLEDs.

They can form the organic optoelectronic device 3 emitting a light impulse which can have a time response below tens of ns, for instance 10 ns, in response to an electrical impulse having a pulse duration time below 10 ns.

The organic optoelectronic device 3 can have two different possible structure.

1a) CPW Electrodes

As shown in FIGS. 2a, 2b, 3a and 3b, the organic optoelectronic device 3 presents a CPW electrodes in GSG configuration (GSG shape: ground-signal-ground).

The organic optoelectronic device 3 presents anode and cathode parts outside the actuatable zones 4, as represented on FIG. 7. The actuatable zones are situated where the OLEDs 2 (anode layer 6, organic layer 9, cathode layer 10) are.

These so-called outer parts allow the anode and the cathode to be connected to the means for selective activation and displaying 14, represented on FIG. 17.

Advantageously in this configuration, the external parts of the cathodes are doubled to insure a 50 ohm characteristic impedance so as to maximize increase the speed of the response, for instance for one cathode 10a (respectively cathode 10b), there are two external parts K1 and K'1 (respectively K2 and K2').

When the layers are deposited in this configuration, the lateral separation profiles 11 form a separation line allowing the fourth metal layer 10 to be separated in two and each part to be connected to the corresponding outer cathode parts.

In this configuration, the cathodes 10a, 10b (and the outer parts of the cathodes K1, K1', K2, K2') have a rectangular shape, and the anodes 6a, 6b (A1 and A2) have a rectangular shape except at the intersection of the two anodes separated by step-shaped engravings 7.

Advantageously, the width of the cathode planes (K1 with K1' or K2 with K2') is at least three times as large as the anode (A1 or A2). The widths of the engraving 7 separating the anode A1 from A2 are few micrometers to few hundred of micrometers.

1b) Biplanar Shape

As shown in FIGS. 4a, 4b, 5a and 5b, the organic optoelectronic device 3 presents a biplanar shape (microstrip).

Advantageously, the anodes (A2, A3) have a "twin" anode (A2', A3') allowing a lower serial resistance, a better pulse delivery and therefore a faster response of the actuatable zones.

In this configuration, a ground plane 15 is located below the substrate 5 on which is the organic optoelectronic device 3.

Advantageously, the organic optoelectronic device 3 have different shape, more preferably a star shape (or a sun shape) and each branch is an electrode.

Advantageously, the number of branches can be designed adequately, a greater number of branches allows to delimit a greater number of actuatable zones.

The engravings 7 allow to separate the different anodes 6a, 6b, 6c between them, while the lateral separation profiles 11 separate the cathodes between them.

Advantageously, the cathodes occupy a part of the branches of the star and the anodes the other part, for example, the cathodes are located on the left branches and the anodes on the right branches, more precisely, the anodes follow each other then the cathodes follow each other, there is no alternation between cathode and anode.

In one possible embodiment, the anodes and cathodes follow each other intermittently (Anode-cathode-anode-cathode . . . ).

As represented on FIG. 6, advantageously, the organic optoelectronic device 3 is a matrix which is rectangular or square, and which presents OLED 2 with different forms configured to realize the matrix. More precisely, the cathodes 10a, 10b and anodes 6a, 6b, 6c are rectangular and/or L-shaped areas, and/or nested to form the matrix.

As represented on FIG. 1, the organic optoelectronic device 3 of the OLEDs 2 can have a metallic contour and/or metallic lines and/or metallic areas 12 to increase the conductivity of the anodes 6a, 6b, 6c of the first layer 6 and allowing to keep an actuatable zone 4a, 4b (anode not covered by the metallization) whether it is larger or smaller. Depending on the dimensions of the zones you would like to have lit (actuatable zones 4a, 4b), the metallization will be more or less small until you have areas, lines or contours.

The actuatable zones 4a, 4b are defined by the superposition of a part of anode and a part of cathode, each actuatable zone 4a, 4b is the surface of at least one OLED 2.

The anodes 6a, 6b, 6c can be contiguous to one another and the cathodes 10a, 10b can be contiguous to one another. For example, the distance between two anodes and two cathodes is a few micrometers (~3 to 10 μm).

For example, the anodes 6a, 6b, 6c are made of ITO (tin-indium oxide) for a downward emission and are made of copper-doped aluminum (Al:Cu) for an upward emission of the OLEDs 2.

The second layer for insulation 8 can have dyes and/or quantum dots to absorb the light emitted from the separated actuatable zones 4a, 4b and re-emit light at another visible wavelength.

Advantageously, the second layer for insulation 8 is on parts of the first layer 6 or parts of the stack of organic layers 9a, 9b, serving to electrically insulate the anodes 6a, 6b, 6c and to ensure the continuity of the individual layers subsequently deposited for organic and metallic layer deposition and having a thickness e1.

Advantageously, the third layer 9 comprises: polymers, small molecules, phosphorescent materials, heat actuatable materials.

As represented on the FIGS. 6-11, 14-15, 18-19, the cathodes Kj can have specific geometrical patterns MKj different from the specific geometrical patterns MAj specific to the anodes.

In another embodiment, the cathodes Kj have specific geometrical patterns MKj different from each other and/or the geometrical patterns MAj specific to the anodes having specific geometrical patterns MKj different from each other.

Preferably, the patterns are geometrical because the patterns are chosen to have precise actuatable zones 4a, 4b defining levels of light intensity.

Preferably, the geometrical patterns MAi and MKj are circles or polygons, more preferably, the polygons have a mathematical ratio allowing the repetition of the pattern. For example, in the case of parallel lines of the same size, the mathematical ratio is a proportionality coefficient equal to 1; in the case of an L shape composed of 3 micro-OLEDs, the mathematical ratio follows this sequence: (n+1)=(n)+2, n representing the number of micro-OLEDs in the pattern, the following sequence means that the next pattern (n+1), adds 2 micro-OLEDs to the number of micro-OLEDs of the previous pattern (n).

The activation of cathodes and anodes can be sequential or parallel.

2) Speed of Propagation of the Electrical Pulse in the System 1 with CPW Electrodes or Biplanar Shape Advantageously, the electrical wires are connected to the first layer 6 and to the fourth layer 10; and wherein the first layer 6, the fourth layer 10 and a ground plane 15 are separated by gaps without conductive material, the gaps having a size so as to adapt the speed of propagation of the electrical pulse in the system 1 for limiting the reflections due to the passage of the electrical impulse between electrical wire and the electrodes (anodes and cathodes).

The gaps can have a size so that an effective dielectric permittivity of the organic optoelectronic device 3 equal to the dielectric permittivity of the electrical wires delivering the electrical impulse.

Advantageously, the first layer 6, the fourth layer 10 and the ground plane 15 are structured to integrate an excitation or a characterization circuit, including at least a resistance, a capacitance and/or an inductance, which are disposed in series and/or parallel.

Advantageously, as represented on FIGS. 5a and 5b, the substrate 5 comprises:
the ground plane 15 is on one side of the substrate 5, and
the first layer 6 and the fourth layer 10 are tracks on the other side of the substrate 5 and are electrically linked to the ground plane 15 with vias.

The first layer 6 can extend between two ground planes 15 on the same side of the substrate 5, at equal distance of the two ground planes 15, and is separated from the two ground planes 15 with some gaps G without conductive material.

The transversal dimension T of the first layer 6 and the transversal dimension of the gap G between said first layer 6 and each of the two ground planes 15 can be such that the effective dielectric permittivity e, effective defined by $$\epsilon_r \text{effective} = 1 + \frac{\epsilon_r - 1}{2} \beta(\gamma_1)\beta(\gamma_2)$$

is equal to $\epsilon_r 0$ the dielectric permittivity of the electrical wire.

Thus, $\epsilon_r$ is the dielectric permittivity of the dielectric substrate 5, $\gamma_1$, $\gamma_2$ and $\gamma_3$ are geometrical parameters, $$\gamma_1 = T/(T + 2G);$$

$$\gamma_2 = \frac{\sinh\left(\pi \frac{T}{4h}\right)}{\sinh\left(\pi \frac{T+2G}{4h}\right)};$$

$$\beta_1(\gamma) = \frac{\pi}{\ln\left(2\frac{1+\sqrt{\gamma_3}}{1-\sqrt{\gamma_3}}\right)};$$

defining $\beta(\gamma)$ for $\gamma_1$ and $\gamma_2$ in the interval $0 < \gamma < 1/\sqrt{(2)}$.

$$\beta_2(\gamma) = \frac{\ln\left(2\frac{1+\sqrt{\gamma}}{1-\sqrt{\gamma}}\right)}{\pi};$$

defining $\beta(\gamma)$ for $\gamma_1$ and $\gamma_2$ in the interval $1/\sqrt{(2)} < \gamma < 1$;

h being the thickness of the dielectric substrate 5, and $\epsilon_r$ represents the relative dielectric permittivity of the dielectric substrate 5. T represents the transversal dimension of the anode 6a, 6b, 6c. G is the distance between the anode 6a, 6b, 6c and ground planes 15 (cathode 10a, 10b in some configurations).

These ground planes 15 are present on either side of the anode 6a, 6b, 6c and are connected to each other either by the external circuit or by the geometry of the electrodes. For a given dielectric, the characteristic impedance of planar electrodes to produce fast opto-electronic components is given mainly by the form factor defined by the ratio γ1.

For example, the condition for obtaining the same effective relative dielectric permittivity for the electrodes as for the cables, results in ∈ reffective=$\epsilon_r$=1.5.

So, we obtained a relation between T, G and the ratio T/(T+2G). To reduce or cancel these reflections, it is therefore possible to modify the geometry of the µ-OLED and in particular the ratio T/(T+2G).

Considering a glass substrate ($\epsilon_r$=7.75) of thickness H=1000 µm, and tin oxides and indium (ITO) electrodes with a conductivity σ=5.95e$^5$ of 100 nm thickness.

Given a predefined Transversal dimension T value, we calculate Gap G value such as $\epsilon_r \text{ }_{effective}$=1.5 to obtain the following table of dimensions:

| T | G | T/(T + 2G) |
|---|---|---|
| 100 µm | 30 µm | 0.625 |
| 200 µm | 60 µm | 0.625 |
| 500 µm | 146 µm | 0.631 |
| 1 mm | 267 µm | 0.651 |
| 2 mm | 433 µm | 0.697 |
| 3 mm | 548 µm | 0.732 |
| 4 mm | 640 µm | 0.757 |
| 5 mm | 720 µm | 0.776 |
| 10 mm | 1027 µm | 0.829 |

In reference to FIGS. 2a, 2b, 3a, 3b, different coplanar electrode structures are illustrated.

Figure 2A:
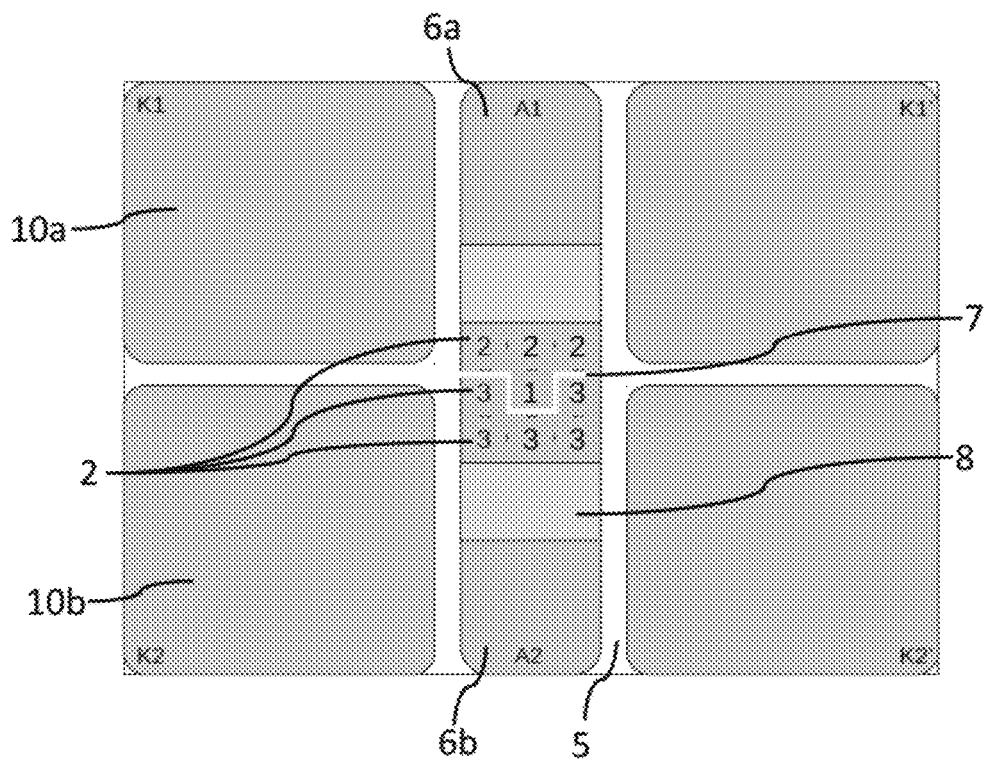
FIG. 2a represents a top view of the organic optoelectronic device according to the invention with Co-Planar Waveguide electrodes (CPW) in Ground-Signal-Ground (GSG) configuration, without: the lateral separation profiles, the organic layer and the fourth layer of metal.
Figure 2B:
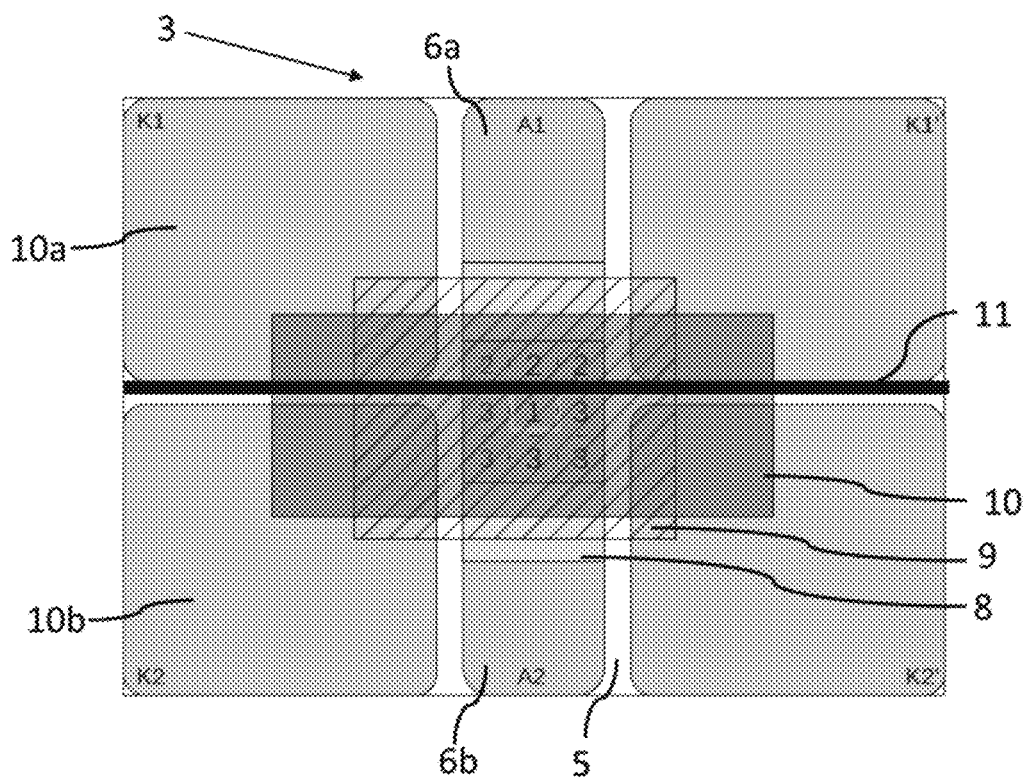
FIG. 2b represents a top view of the organic optoelectronic device according to the invention of CPW electrodes in GSG configuration {2×2 OLED matrix; 2 cathodes (one first cathode K1+K'1 with metal on the first side of the lateral separation profile; one second cathode: K2+K'2 with metal on the second side of the lateral separation profile)×2 anodes OLED matrix}.
Figure 4A:
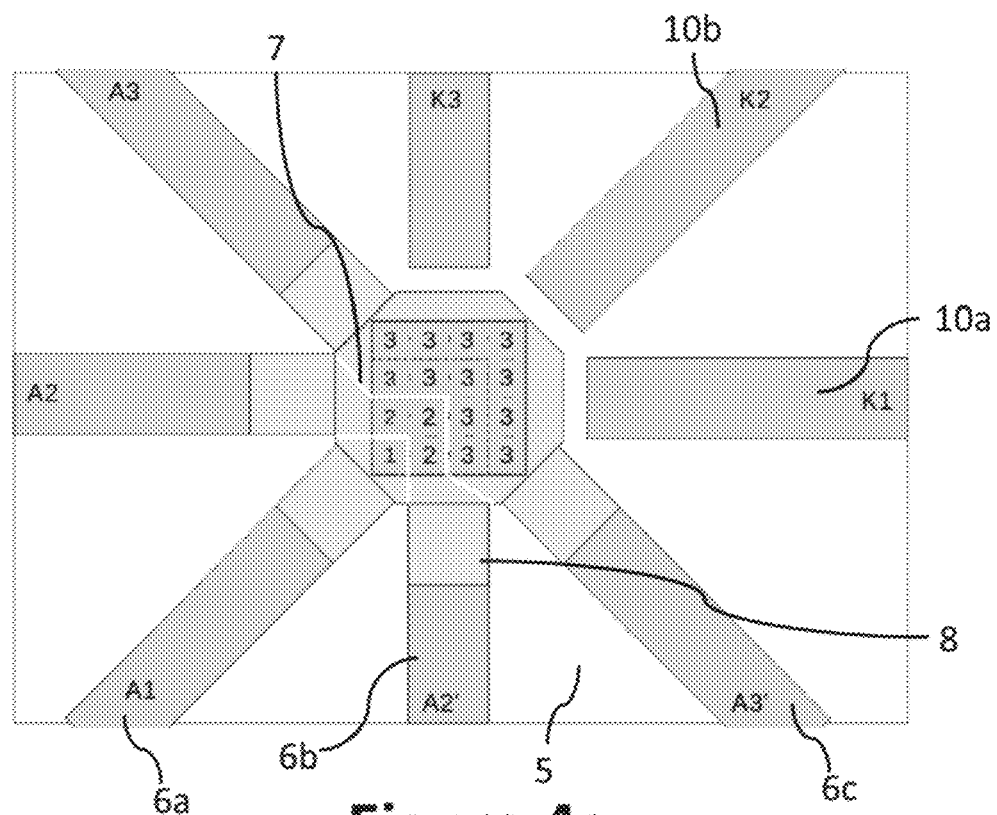
FIG. 4a represents a top view of the organic optoelectronic device according to the invention in biplanar (microstrip) configuration, without: the lateral separation profiles, the organic layer and the fourth layer of metal, the numbers refer to the anode (A1, respectively A2+A'2, respectively A3+A'3) responsible for the activation of the zone (1, respectively 2, respectively 3).
Figure 4B:
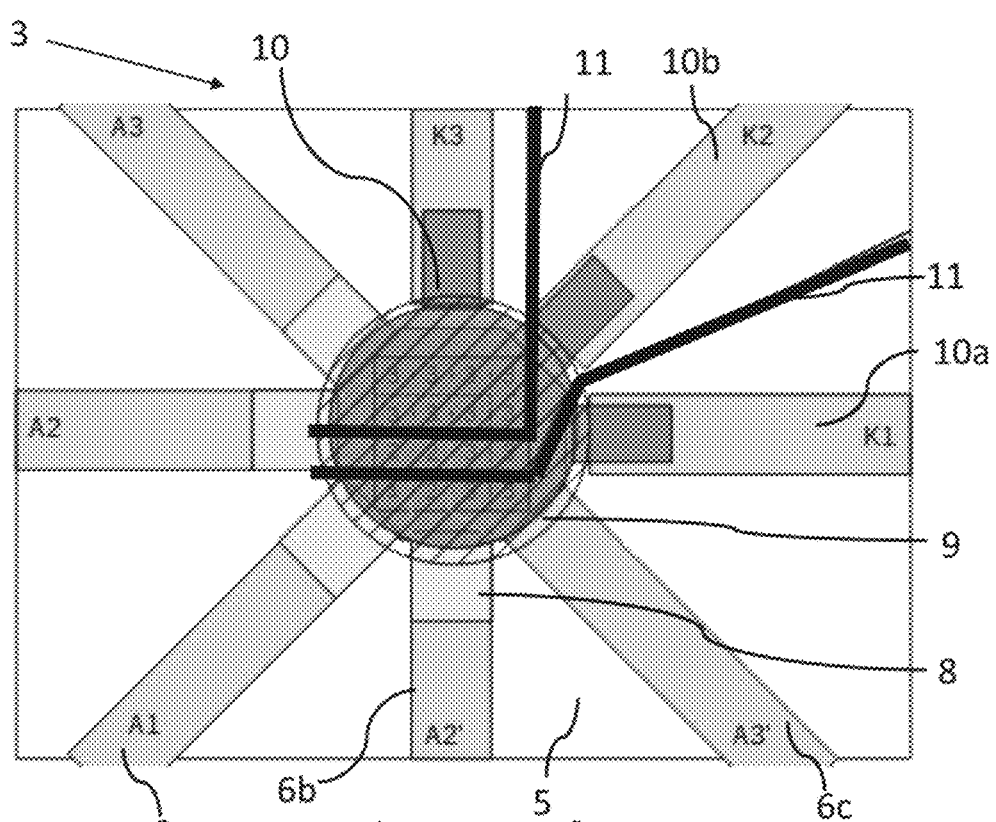
FIG. 4b represents a top view of the organic optoelectronic device according to the invention in biplanar (microstrip) configuration (3×3 OLED matrix; 3 cathodes (K1, K2, K3)×3 anodes OLED matrix), the numbers refer to the anode (A1, respectively A2+A'2, respectively A3+A'3) responsible for the activation of the zone (1, respectively 2, respectively 3).

The dielectric substrate 5, can be a glass sample covered with a conductive layer 6, for example with ITO (FIG. 2a).

Electrodes are structured by removing the conductive layer by at least two parallel continuous lines of transversal dimension G. This allows creating central electrodes of transversal dimension T separated by a distance G from two ground planes 15, (cathodes in the FIG. 2*a*). This dimensioning makes it possible to ensure continuity of propagation with the excitation source and its connection (the same principle applies to other target frequencies above 1 GHz, for example). Indeed, the gaps G is dimensioned to adapt the speed of propagation of the electrical pulse in the device for limiting the reflections due to the passage of the electrical impulse between electrical wire and the planar electrode. Moreover, the gaps G have a size so that an effective dielectric permittivity of the Organic Opto-Electronic device 3 equal to the dielectric permittivity of the electrical wire delivering the electrical impulse (plus or minus 10%).

The following table illustrates the different geometries allowing the reduction of the impulsions:

|  | Co-planar electrodes | | | | Bi-planar electrodes | | | |
|---|---|---|---|---|---|---|---|---|
| Substrate | h | T | G | Z | h | t | T | Z |
| Glass $\varepsilon_r = 7.75$ | 1100 µm | 1000 µm | 550 µm | 50.0Ω | 1100 µm | 100 nm(Au) | 1325 µm | 50.0Ω |
|  | 1100 µm | 500 µm | 175 µm | 50.2Ω |  |  |  |  |
|  | 1100 µm | 100 µm | 31 µm | 50.2Ω |  |  |  |  |
|  | 900 µm | 100 µm | 31 µm | 50.2Ω |  |  |  |  |
| Silicon $\varepsilon_r = 11.9$ | 275 µm | 250 µm | 125 µm | 49.9Ω | 275 µm | 100 nm(Au) | 219 µm | 50.0Ω |
|  | 275 µm | 50 µm | 195 µm | 50.0Ω |  |  |  |  |
|  | 525 µm | 500 µm | 247 µm | 50.0Ω | 525 µm | 100 nm(Au) | 418 µm | 50.0Ω |
|  | 725 µm | 500 µm | 267 µm | 50.0Ω | 725 µm | 100 nm(Au) | 577 µm | 50.0Ω |
|  | 725 µm | 1000 µm | 437 µm | 50.0Ω |  |  |  |  |
| Germanium $\varepsilon_r = 16$ | 500 µm | 1000 µm | 525 µm | 50.0Ω | 500 µm | 100 nm(Au) | 286 µm | 50.0Ω |
| GaN $\varepsilon_r = 5.35$ | 500 µm | 1000 µm | 130 µm | 50.0Ω | 500 µm | 100 nm(Au) | 822 µm |  |
| Soft substrate (PET) $\varepsilon_r = 5$ | 500 µm | 1000 µm | 118 µm | 50.0Ω |  |  |  |  |
|  | 500 µm | 500 µm | 69 µm | 50.0Ω |  |  |  |  |
| plexiglass $\varepsilon_r = 3.5$ | 500 µm | 242 µm | 20 µm | 50.0Ω |  |  |  |  |

In a possible embodiment, the system 1 comprises:
the first layer 6 or the fourth layer 10 can be the ground plane 15; and/or
the ground plane 15 is on one side of the substrate 5, and the first layer 6 and the fourth layer 10 are tracks on the other side of the substrate 5 and are electrically linked to the ground plane 15 with vias; and/or
the geometry of the first layer 6 and of the ground plane 15 in regard to the geometry of the fourth layer 10 create an impedance of the device equal to 50 ohms or 75 ohms; and/or
the first layer 6 and/or the fourth layer 10 presents a conductive and transparent layer; and/or
the fourth layer 10 is the cathode made of ITO (indium tin oxide), and the first layer 6 is the anode and is made with a metallic layer; and/or
the dielectric substrate 5 is Glass, silicon, silicon oxide, silicon oxide on silicon, polymers or flexible substrate; and/or
the Organic Opto-Electronic device 3 is composed of OLEDs or Organic photodiodes; and/or
the system 1 comprises superposed on the dielectric substrate 5, the first layer 6 with a first extremity; the fourth layer 10, with another extremity covering partially said first extremity and said organic layer stack 9*a*, 9*b* with a part, defining an actuatable zone 4*a*, 4*b* of the Micro Organic Opto-Electronic device 3; and/or
the Micro Organic Opto-Electronic device 3 being modeled with a resistance in series with a diode which is in series with a resistance, or by a resistance in series with a dynamic resistance, at least one junction capacitance in parallel with the diode and the resistance, or in parallel with the dynamic resistance, for modelling the actuatable zone 4*a*, 4*b*; and/or
the first layer 6 and/or the fourth layer 10 presents a transparent and conductive layer; and/or
the branch connecting the two arms comprises one or several photonic elements; and/or
the photonic element is chosen among the list: a waveguide, a grating, a Distributed Feedback mirror, a laser cavity, a laser cavity made of distributed feedback mirrors, a photonic crystal, a laser cavity made of a defect in a photonic crystal.

2) Activation Combinations

There are three different types of activation combinations:

1. Separated Anodes—Common Cathode

In this case, the µOLEDs are defined by cutting the anode into several zones electrically separated from each other. This separation is achieved, for example, by etching the transparent and conductive ITO layer.

In the example of FIG. 6, the anode is structured in three contacts A1, A2 and A3 obtained by etching, through which it is possible to switch on the µOLED of group 1, the 3 µOLEDs of group 2, or the 5 µOLEDs of group 3. To activate the µOLED 1, a voltage must be applied between the contacts A1 and the common cathode K, and for the µOLEDs 2 it will be between the anodes A2 and the common cathode K and finally for the µOLEDs 3 between A3 and K.

In FIG. 7, image a) represents level 0, i.e. a light emission of zero intensity (0 µOLED on). Image b) represents level 1, i.e. a low intensity light emission (1/9 µOLED on or 1 µOLED out of 9). Image c) represents level 2, which is a medium intensity light emission (4/9 µOLED on or 4 µOLED out of 9). And image d) represents level 3 a high intensity light emission-9/9 µOLED on or 9 µOLED on 9).

In the classical display, the pixels have only two states: on or off, from a light point of view it is a 0 or a 1. In terms of information transmission, with pixels there are only two states, while with matrix OLEDs the number of states depends on the number of cathodes and anodes, for example with 3 anodes and 1 cathode, as shown in FIG. 6, there are at least 4 possible states, as shown in FIG. 7.

2. Common Anode, Separated Cathodes

In this configuration, the final patterns are not implemented by different areas at the transparent and conductive anode, but by different cathodes K1, K2, K3, as shown in FIG. 8. The difficulty in separation the cathodes is important because of the manufacturing process of the OLEDs themselves. In this case, the claims of inverted profiles apply.

3. Separated Anodes-Separated Cathodes (Definition of Patterns Jointly by Anode and Cathode)

Approach 2. (common anode, separate cathodes) may show limitations in some particular cases, especially when some patterns are almost nested in others, and when the electrical contacts to the excitation source are difficult to make.

FIG. 9.*a* illustrates an example of difficult nesting, creating two strangulation points. These choke points are likely to induce a high contact resistance in case of engraving, thus making the grip with A1 difficult or inefficient. This can result in differences in brightness of the areas A1 compared to A2 or A3. In such a case, an alternative consists in redistributing the patterns by returning others to the cathode, as shown in FIG. 9. For example, one can transfer the μOLEDs from level 2, by taking the contacts K1 and K2. Resin lines structured in undercut resin would then allow to partition the cathode.

Advantageously, each actuatable zone can be turned on separately.

In FIG. 11, image a) represents level 0, i.e. a light emission of zero intensity (0 μOLED on). Image b) represents level 1, i.e. a low intensity light emission (1/9 μOLED on or 1 μOLED out of 9), this level is obtained by activating the actuatable zone (1 μOLED) of the center by activating the anode A1 and the cathode K2. Image c) represents level 2, which is a medium intensity light emission (4/9 μOLED on or 4 μOLEDs out of 9), this level is obtained by activating the actuatable zones (4 μOLEDs) of the center and the bottom by activating the anode A1 and the cathodes K1 & K2. And image d) represents level 3 a high intensity light emission (9/9 μOLED on or 9 μOLEDs on 9), this level is obtained by activating all the actuatable zones (9 μOLEDs) (center, bottom and top) by activating the anodes A1 & A2 and the cathodes K1 & K2.

It is then possible to switch on level 1 by making contact between anode A1 and cathode K1; level 2 will be the combination of anode A1 and cathode K1 and K2; and to switch on level 3, all contacts A1, A2 and A3; K1, K2 and K3 must be made.

Another alternative to the problem of strangulation or nested patterns would be to print very fine conductive tracks of noble metal such as gold, for example, on the anode patterns. This improves the injection of current and its flow both within the patterns and at the choke points.

The system 1 for transmitting with several OLEDs 2 can be a matrix of organic light emitters, e.g. a 3×3 device (anodes×cathodes), as shown in FIG. 9.*e*. The OLEDs 2 are structured and combined to obtain four different light intensities corresponding to the four modulation levels.

In this example, the structuring of this matrix is based on inverted profiles. The activation of the different parts of the matrix can be done by the activation of a combination of anode and cathode, in fact to switch on the different levels, a judicious combination of cathode/anode is activated.

In an example of embodiment, as shown in FIG. 18, it is possible to emit by combining the anode(s) and cathode(s) up to a minimum of 8 states of different levels, shown in FIG. 19.

In the configuration shown, the switching speed is limited by the series resistance and the parasitic capacitance of the largest OLED (64 μOLED). The series resistance decreases with the width of the electrodes and the parasitic capacitance increases with the surface of the OLED. So the capacitance increases faster than the resistance.

For example, as shown in FIG. 13, by using 4 levels, it is possible to assign 2 bits to each level as opposed to a 2-level transmission. The transmission will therefore be doubled for the same time and speed compared to a 2-bit signal. In this example:

level 0 corresponds to bit 00 (all OLEDs are off), level 1 corresponds to bit 01 (OLED 1 is on), level 2 corresponds to bit 11 (OLEDs of group 1 and 2 are on) and level 3 corresponds to bit 10 (all OLEDs are on).

In this example, it is possible to assign 3 bits (and starting 4th bit) and to have more than 4 levels:

| Level | bit | OLEDs |
| --- | --- | --- |
| 0 | 000 | off |
| 1 | 001 | OLED 1 on |
| 2 | 010 | OLED 2 on |
| 3 | 011 | OLEDs 1 & 2 on |
| 4 | 100 | OLED 3 on |
| 5 | 101 | OLEDs 1 & 3 on |
| 6 | 111 | OLEDs 2 & 3 on |
| 7 | 1000 | OLEDs 1 & 2 & 3 on |

The means for selective activation and displaying 14 can be a processor, a computer or a microcontroller.

Preferably, the means for selective activation and displaying 14, activate one couple (one pair) anode-cathode to turn on one actuatable zone.

Advantageously, the means for selective activation and displaying 14 of the separated actuatable zones 4*a*, 4*b* are: a pulse circuit of the electrical clock or flip-flop type, with a positive and a negative output, switches controlled by the pulse circuit and connecting anodes and cathodes to the power source of the battery or accumulator or generator type (power supply 13).

The means for selective activation and displaying 14 can be configured to enable at least 3 levels of light intensity to be achieved with the actuatable zones 4*a*, 4*b*, through four examples.

Examples of Combination for Three Actuatable Zones

Example 1 a first level of light intensity, by the activation of one actuatable zone 4*a*, 4*b*, by the combination of an activated anode, and a cathode activated facing the anode, a second level of light intensity by the activation of two actuatable zones 4*a*, 4*b*:

by a combination of at least two activated anodes facing at least one activated cathode, or by a combination of at least one anode facing at least two cathodes, a third level of light intensity by the activation of three actuatable zones 4a, 4b:
  by a combination of at least three anodes facing at least one cathode, or
  by a combination of at least one anode facing least three cathodes, or
  by a combination of at least two anodes facing least two cathodes.

Example 2 a first level of light intensity, by the activation of one actuatable zone 4a, 4b, by the combination:
a first activated anode, and
a first common cathode activated facing the first anode,
a second level of light intensity, by the activation of at least two separated actuatable zones 4a, 4b, by the combination:
a first activated anode, and a second activated anode, and
a first common cathode activated facing the two anodes,
a third level of light intensity, by the activation of at least three separated actuatable zones 4a, 4b, by the combination:
a first activated anode, a second activated anode and a third activated anode, and
a first common cathode activated facing the three anodes.

Example 3 a first level of light intensity, by the activation of one actuatable zone 4a, 4b, by the combination:
a first common anode activated, and
a first activated cathode facing the first anode,
a second level of light intensity, by the activation of at least two separated actuatable zones 4a, 4b, by the combination:
a first common anode activated, and
a first activated cathode and a second activated cathode facing the first common anode,
a third level of light intensity, by the activation of at least three separated actuatable zones 4a, 4b, by the combination:
a first common anode activated, and
a first activated cathode, a second activated cathode and a third activated cathode facing the first common anode.

Example 4 a first level of light intensity, by the activation of one actuatable zone 4a, 4b, by the combination:
a first activated anode, and
a first cathode activated facing the first anode,
a second level of light intensity, by the activation of at least two separated actuatable zones 4a, 4b, by the combination:
a first activated anode and a second activated anode,
a first activated cathode facing the first anode and a second activated cathode facing the second anode,
a third level of light intensity, by the activation of at least three separated actuatable zones 4a, 4b, by the combination:
a first activated anode, a second activated anode and a third activated anode,
a first activated cathode facing the first anode, a second activated cathode facing the second anode and a third activated cathode facing the third anode.

The substrate 5 can be transparent for a Top Emission and not transparent for a Bottom Emission. More precisely, the substrate 5 is a flexible substrate or made of glass, silicon, silicon oxide, silicon oxide on silicon, polymer, gallium nitride, diamond.

Advantageously, the fourth layer 10 is a metallic layer and depending on the thickness, the metallic layer 10 (the fourth layer) can be transparent (20 nm thick) or opaque (>100 nm). More precisely, in the case of a Top Emission, a transparent cathode will be used and for a Bottom Emission, an opaque cathode will be used.

3) Process of Manufacturing

As represented on FIGS. 20-23, the invention relates to also a process of manufacturing an organic optoelectronic device 3 of the OLED type comprising:
  the manufacturing (realization) on a substrate 5 of the anodes by:
    depositing a first transparent and conductive layer 6 on the substrate 5, formed by several transparent and conductive anodes separated laterally by engravings 7;
    predefined structuring of a specific geometric pattern for each anode;
  the deposition of a second layer for insulation 8 on parts of the first layer 6 and on the engravings 7, serving to electrically insulate the anodes 6a, 6b, 6c and having a thickness e1;
  the realization of lateral separation profiles 11 of thickness e4;
  the deposition of the third layer 9 of organic layers 9a, 9b with a thickness e2, by evaporation on: the separated anodes 6a, 6b, 6b, the second layer for insulation 8, and the lateral separation profiles 11;
  deposition of the fourth layer of metal 10 with a thickness e3, by evaporation of a metal on the organic layers 9a, 9b and the lateral separation profiles 11, to form the cathodes 10a, 10b, which are separated laterally by the lateral separation profiles 11,
  the thickness e4 being greater than e1+e2+e3,
  the covering of the anodes 6a, 6b, 6c of the stack of organic layers 9a, 9b, and of the cathodes 10a, 10b, so as to present opposite each other:
    separated anodes and a common cathode;
    separated anodes and separated cathodes; and/or
    a common anode and separated cathodes;
  defining separated actuatable zones 4a, 4b, each actuatable zone 4a, 4b comprising at least one cathode part and at least one anode part facing each other.

The process can be use photolithography and engraving, and advantageously comprises the following steps:
  for structuring the anodes 6a, 6b, 6c:
    deposition of a photosensitive resin R1 on the first layer 6;
    positioning of a photolithography mask T1, whose openings allow the predefined structuring of a specific geometric pattern for each anode, on the photosensitive resin R1;
    photolithography by exposure of the photosensitive resin R1 through the first openings, development, engraving in the first layer to make the separated anodes and cleaning of the resin;
  for depositing the second layer for insulation 8:
    deposition of a second layer for insulation 8 comprising a photosensitive resin R2 with a thickness e1 on the separated anodes constituting the first layer 6;
    positioning of a photolithography mask T2;

exposure photolithography and development of the second layer for insulation 8;

for the realization of lateral separation profiles 11:
deposition of at least one photosensitive resin R3 on the anodes and the second layer for insulation 8;
positioning of a photolithography mask T3 whose openings make it possible to create the lateral separation profiles 11;
UV exposure photolithography and development of the photoresist to produce the lateral separation profiles 11.

Advantageously, before the second layer for insulation 8 is applied to the first layer 6, the following steps are carried out:
deposition of a layer of photosensitive resin R2 on the anodes 6a, 6b, 6c;
positioning of a photolithography mask T2 whose openings define the locations intended to receive a metallic layer to produce a metallic contour and/or metallic lines and/or metallic area 12;
photolithography by exposing the positive photosensitive resin layer R2 through the openings and developing;
deposition of the metal layer 12 in such a way that the areas of the anodes 6a, 6b, 6c not covered by the second layer 8 are covered by the metal layer in direct contact with the first layer;
cleaning the photosensitive resin layer R2 to remove it.

Advantageously, before depositing the light-sensitive resin on the anodes and/or on the second layer for insulation 8, a non-photosensitive resin is deposited on this light-sensitive resin, in order to produce inverted lateral separation profiles 11 which have:
a tip which is in contact with the layer formed by a plurality of separated anodes; and
a base widened in relation to the tip and located above the layer formed by the separated cathodes.

Advantageously, the photosensitive resin R1 deposited on the first layer 6 is positive or negative, the photosensitive resin R2 forming the second layer 8 is negative, and the photosensitive resin R3 for making the lateral separation profiles 11 is positive.

The openings of the second mask T2 can be arranged on the second layer for insulation 8, so that photolithography and etching of the second layer for insulation 8 leave the spaces between the anodes filled by the second layer for insulation 8.

The first layer 6 can be an ITO layer to make the anodes 6a, 6b, 6c and in which aluminum or chromium gold is deposited by evaporation to make the cathodes 10a, 10b.

Advantageously, the gold-chromium is deposited just after the structuring (engraving) of the anode in order to improve the conductivity in the case of Bottom Emission. More precisely, in the case of Top Emission, the Gold-Chromium deposit is not necessary or even not useful and silver is used for the Top Emission and aluminum can be used in Bottom Emission.

Details of the Process

The organic optoelectronic device 3 can be fabricated on different types of rigid substrates such as Glass, Silicon or Gallium Nitride with top emission.

In another possible embodiment, the manufacturing process can follow the following steps:
Step 1—the realization of the anodes 6a, 6b, 6c on a substrate 5 (Structuring of the anode)
  Cleaning step
  Photolithography step
  Engraving step
  Cleaning step Step 2—Metallization
  Cleaning step
  Photolithography step
  Metallization
  Lift-Off Step 3—Structuring of the partition lines of the cathode in "cap profile"
  Cleaning step
  Photolithography on base plate of separation profile Step 4—Organic layer and cathode deposition (Aluminum)

The last step in the OLED manufacturing process consists of depositing the organic and metallic layers.
  Vacuum Thermal Evaporation
  Encapsulation Results In FIG. 24, researchers have studied the electrical and optical responses of µOLEDs small molecules under pulsed excitation:
the FIG. 24 show the excitation signal, the electrical response and the optical response for pulses of 800 ps, 1 ns and 20 ns.

In FIGS. 25A & 25B, researchers have studied the electrical and optical responses of µOLEDs polymers under pulsed excitation:
the figures show the excitation signal, the electrical response and the optical response for pulses of 300 ps up to 1 ns.
Polymer-based µOLEDs respond at 300 ps, a first in the world.

The results of these matrix OLEDs reach world records, optical responses of less than 800 ps have been recorded following an electrical excitation for ultra-short pulse durations on µOLEDs and 300 ps for Polymer OLEDs. These worldwide results are a revolution for applications such as optical telecommunications, optical buses, Lifi, etc.

The invention claimed is:

1. A light emitting system intended for optical communication, having several micro-OLEDs whose activation allows obtaining different levels of light intensity corresponding to different levels of light modulation, with emission of light impulse with a time response below 10 ns in response to an electrical impulse having a pulse duration time below 10 ns, the system comprising:
an organic optoelectronic device with micro-OLEDs, the organic optoelectronic device having laterally separated actuatable zones on a substrate which supports:
a first layer composed of several transparent and conductive anodes, laterally separated by engravings, each anode (Ai) having a specific geometric pattern (MAi);
a second layer for insulation on parts of the first layer, serving to electrically insulate the anodes so as to have separated anodes, the second layer for insulation having a thickness e1;
a third layer having a thickness e2 and comprising at least one stack of organic layers;
a fourth layer of metal having a thickness e3, and comprising several cathodes laterally separated from each other and covering said at least one stack of organic layers, each cathode (Kj) having a specific geometrical pattern (MKj);
lateral separation profiles of the cathodes and of the organic layers, to electrically insulate the cathodes so as to have separated cathodes, the lateral separation profiles having a thickness e4 greater than e1+e2+e3, and being deposited on the first layer or on the second layer for insulation, wherein covering of the anodes, the at least one stack of organic layers, and the cathodes, is realized so as to present said anodes and said cathodes facing each other, the system comprising one of the following configurations:

separated anodes and a common cathode;
separated anodes and separated cathodes; or
a common anode and separated cathodes;

defining separated actuatable zones, each actuatable zone comprising at least one part of any said cathode and at least one part of any said anode facing each other, a power supply, electrical wires and electrical contacts connected to the anodes and cathodes for their voltage supply so as to allow during an activation:

a switching on of a combination of said actuatable zones, a surface of said actuatable zones being less than or equal to a common surface of facing activated anodes and activated cathodes, connected to the electrical wires, at least one processor adapted for selective activation and displaying, to activate and display at each activation a total luminous surface which varies according to the number of the actuatable zones turned on, so as to obtain different levels of luminous intensity of the system corresponding to different levels of light modulation, for different activations, wherein the first layer, the fourth layer and a ground plane are separated by gaps without conductive material, the gaps having a size so as to adapt a speed of propagation of an electrical pulse in the device for limiting reflections due to passage of an electrical impulse between the electrical wires and the anodes and the cathodes, the gaps having a size so that an effective dielectric permittivity of the organic optoelectronic device is equal to a dielectric permittivity of the electrical wires delivering the electrical impulse, wherein the organic optoelectronic device presents outer anode parts and outer cathode parts outside the actuatable zones, the actuatable zones being situated where the micro-OLEDs (2) are located, the outer cathode parts and the outer anode parts adapted to allow the anode and the cathode to be connected to the processor which is adapted for selective activation and displaying, wherein:

either the organic optoelectronic device presents Co-Planar Waveguide electrodes (CPW) in Ground-Signal-Ground (GSG) configuration, and the outer cathode parts configured to function as ground planes, or the ground plane is on one side of the substrate, and the anode and the cathode are tracks on the other side of the substrate and are electrically linked to the ground plane with vias.

2. The system according to claim 1, wherein the cathodes (Kj) have specific geometrical patterns (MKj) different from the geometrical patterns (MAi) specific to the anodes.

3. The system according to claim 1, wherein the cathodes (Kj) have specific geometrical patterns (MKj) different from each other, and/or wherein the geometrical patterns (MAi) specific to the anodes have specific geometrical patterns (MAi) different from each other.

4. The system according to claim 1, wherein the organic optoelectronic device is a matrix that is rectangular or square.

5. The system according to claim 1, wherein the cathodes and anodes are rectangular and/or L-shaped areas, and/or nested to form a matrix.

6. The system according to claim 1, wherein the outer cathode parts of the cathodes are doubled to ensure a 50-ohm characteristic impedance so as to maximize increased speed of the response, the lateral separation profiles forming a separation line allowing the fourth layer of metal to be separated into two parts and each part to be connected to the corresponding outer cathode parts.

7. The system according to claim 1, wherein: at least one said anode extends between two of said cathodes on a same side of the substrate, at equal distance from the two cathodes, and is separated from the two cathodes by the gaps without conductive material;

a transversal dimension T of the at least one anode and a transversal dimension G of the gap between said at least one anode and each of the two cathodes are such that an effective dielectric permittivity er defined by: $1+(\epsilon r-1)/2*\beta(\gamma_2)\beta(\gamma_1)$ is equal to $\epsilon r_0$, which is the dielectric permittivity of the electrical wire;

where:
$\epsilon r$ is the dielectric permittivity of the dielectric substrate,
$\gamma_1$, $\gamma_2$, and $\gamma_3$ are geometrical parameters, $$\gamma_3 = \sqrt{(1 - \gamma_1^2)};$$

$$\gamma_1 = T/(T + 2G);$$

$$\beta 1(\gamma) = \frac{\pi}{\ln\left(2\frac{1+\sqrt{\gamma_3}}{1-\sqrt{\gamma_3}}\right)}$$

defining $\beta(\gamma)$ for $\gamma_1$ and $\gamma_2$ in the interval $0<\gamma<1/\sqrt{(2)}$;

$$\beta 2(\gamma) = \frac{\ln\left(2\frac{1+\sqrt{\gamma}}{1-\sqrt{\gamma}}\right)}{\pi}$$

defining $\beta(\gamma)$ for $\gamma_1$ and $\gamma_2$ $$\gamma 2 = \frac{\sinh\left(\pi\frac{T}{4h}\right)}{\sinh\left(\pi\frac{T+2G}{4h}\right)};$$

in the interval $1/\sqrt{(2)}<\gamma<1$.

8. The system according to claim 1, wherein:
the anodes are made of ITO for a downward emission and copper-doped aluminum for an upward emission of the OLEDs;
the stack of organic layers comprise: polymers, small molecules, phosphorescent materials, or heat actuatable materials;
the substrate is a flexible substrate or made of glass, silicon, silicon oxide, silicon oxide on silicon, polymer, or gallium nitride.

9. The system according to claim 1, wherein the at least one processor adapted for activation and displaying is configured to enable at least three levels of light intensity to be achieved with the actuatable zones:

a first level of light intensity, by the activation of one actuatable zone, by the combination of an activated anode, and an activated cathode facing the anode, a second level of light intensity by the activation of two actuatable zones:
  by a combination of at least two activated anodes facing at least one activated cathode, or
  by a combination of at least one anode facing at least two cathodes, a third level of light intensity by the activation of three actuatable zones:
  by a combination of at least three anodes facing at least one cathode, or
  by a combination of at least one anode facing least three cathodes, or
  by a combination of at least two anodes facing least two cathodes.

10. The system according to claim 1, wherein the at least one processor adapted for selective activation and displaying are configured to allow at least three levels of light intensity to be achieved with the actuatable zones:
  a first level of light intensity, by activation of one said actuatable zone, by the combination of:
    a first activated anode,
    a first cathode activated facing the first anode,
  a second level of light intensity, by activation of at least two separated ones of said actuatable zones, by the combination of:
    a first activated anode and a second activated anode, and
    a first cathode activated facing the first and second anodes,
  a third level of light intensity, by activation of at least three separated ones of said actuatable zones, by the combination of:
    a first activated anode, a second activated anode and a third activated anode, and
    a first cathode activated facing the first, second and third anodes.

11. The system according to claim 1, wherein the at least one processor adapted for selective activation and displaying are configured to allow at least three levels of light intensity to be achieved with the actuatable zones:
  a first level of light intensity, by activation of one said actuatable zone, by the combination of:
    a first anode activated, and
    a first activated cathode facing the first anode,
  a second level of light intensity, by activation of at least two separated ones of said actuatable zones, by the combination of:
    a first anode activated, and
    a first activated cathode and a second activated cathode facing the first anode,
  a third level of light intensity, by activation of at least three separated ones of said actuatable zones, by the combination of:
    a first anode activated, and
    a first activated cathode, a second activated cathode and a third activated cathode facing the first anode.

12. The system according to claim 1, wherein the at least one processor adapted for selective activation and displaying are configured to allow at least three levels of light intensity to be achieved with the actuatable zones:
  a first level of light intensity, by activation of one actuatable zone, by the combination of:
    a first activated anode, and
    a first cathode activated facing the first anode,
  a second level of light intensity, by activation of at least two separated ones of said actuatable zones, by the combination of:
    a first activated anode and a second activated anode,
    a first activated cathode facing the first anode and a second activated cathode facing the second anode,
  a third level of light intensity, by activation of at least three separated ones of said actuatable zones, by the combination of:
    a first activated anode, a second activated anode and a third activated anode,
    a first activated cathode facing the first anode, a second activated cathode facing the second anode and a third activated cathode facing the third anode.

13. The system according to claim 1, wherein the first layer, the fourth layer and the ground plane are structured to integrate an excitation or a characterization circuit, including at least a resistance, a capacitance and/or an inductance, which are disposed in series and/or parallel.

14. A process of manufacturing the light emitting system according to claim 1, comprising the following steps:
  manufacturing of anodes, on a substrate, by:
    depositing said first layer composed of transparent and conductive anodes on said substrate;
    predefined structuring of the specific geometric pattern for each anode;
  deposition of said second layer for insulation on parts of the first layer and on the engravings, serving to electrically insulate the anodes;
  manufacturing said lateral separation profiles;
  deposition of said third layer of organic layers, by evaporation on:
the separated anodes, the second layer for insulation, and the lateral separation profiles;
  deposition of said fourth layer of metal, by evaporation of a metal on the organic layers and the lateral separation profiles, to form said cathodes.

15. The process according to claim 14, further comprising the following steps:
  for structuring the anodes:
  deposition of a first photosensitive resin on the first layer;
  positioning of a first photolithography mask, having openings that allow the predefined structuring of the specific geometric pattern for each anode, on the first photosensitive resin;
  photolithography by exposure of the first photosensitive resin through the openings of the first photolithography mask, development, engraving in the first layer to make the separated anodes and cleaning of the first photosensitive resin;
  for depositing the second layer for insulation:
  said second layer for insulation comprising a second photosensitive resin with a thickness e1 on the separated anodes constituting the first layer;
  positioning of a second photolithography mask;
  exposure, photolithography and development of the second layer for insulation;
  for the realization of lateral separation profiles:
  deposition of at least one further photosensitive resin on the anodes and the second layer for insulation;
  positioning of a further photolithography mask having openings adapted to create the lateral separation profiles;
  UV exposure, photolithography and development of the further photosensitive resin to produce the lateral separation profiles.

* * * * *